(12) United States Patent
Duong et al.

(10) Patent No.: US 8,899,792 B2
(45) Date of Patent: Dec. 2, 2014

(54) HIGH NA OPTICAL SYSTEM AND DEVICE

(75) Inventors: Dung T. Duong, Bee Cave, TX (US); Robert McAlister, Georgetown, TX (US); Randall E. Johnson, Austin, TX (US)

(73) Assignee: Illumitex, Inc., Austin, TX (US)

( * ) Notice: Subject to any disclaimer, the term of this patent is extended or adjusted under 35 U.S.C. 154(b) by 186 days.

(21) Appl. No.: 13/243,052

(22) Filed: Sep. 23, 2011

(65) Prior Publication Data

US 2012/0120662 A1     May 17, 2012

Related U.S. Application Data

(60) Provisional application No. 61/386,050, filed on Sep. 24, 2010, provisional application No. 61/406,503, filed on Oct. 25, 2010, provisional application No. 61/479,661, filed on Apr. 27, 2011, provisional application No. 61/487,511, filed on May 18, 2011.

(51) Int. Cl.

| | |
|---|---|
| *F21V 5/00* | (2006.01) |
| *G02B 19/00* | (2006.01) |
| *H01L 33/58* | (2010.01) |
| *F21K 99/00* | (2010.01) |

(52) U.S. Cl.
CPC .............. *F21K 9/54* (2013.01); *G02B 19/0028* (2013.01); *G02B 19/0061* (2013.01); *H01L 33/58* (2013.01)
USPC .......................................... 362/268; 362/331

(58) Field of Classification Search
USPC .................................. 362/268, 331
See application file for complete search history.

(56) References Cited

U.S. PATENT DOCUMENTS

| | | | |
|---|---|---|---|
| 5,168,401 A | 12/1992 | Endriz | |
| 5,680,257 A | 10/1997 | Anderson | |
| 5,737,300 A * | 4/1998 | Ota et al. | 369/112.24 |
| 5,785,404 A * | 7/1998 | Wiese | 362/555 |
| 6,388,819 B1 | 5/2002 | Leidig | |
| 6,397,009 B1 | 5/2002 | Ito et al. | |
| 6,746,124 B2 | 6/2004 | Fischer et al. | |
| 6,816,449 B2 | 11/2004 | Yoo et al. | |
| 6,819,505 B1 | 11/2004 | Cassarly et al. | |
| 7,077,525 B2 | 7/2006 | Fischer et al. | |
| 7,295,379 B2 | 11/2007 | Tsai | |

(Continued)

OTHER PUBLICATIONS

International Search Report and Written Opinion for International Patent Application No. PCT/US2011/052993, mailed Jan. 17, 2012, Patent Cooperation Treaty, 9 pgs.

(Continued)

*Primary Examiner* — Ali Alavi
(74) *Attorney, Agent, or Firm* — Sprinkle IP Law Group

(57) ABSTRACT

Embodiments described herein provide an optical system having a light source (e.g., LED) and a high numerical aperture multi-element optical stack. According to one embodiment, the optical stack can reimage an entrance aperture. The multi-element optical stack can include a number of optical elements forming a series of lenses. The series of lenses comprises, a first lens positioned to receive light emitted in a first beam angle and a second lens more distal from the LED than the first lens, the second lens defining a second lens exit aperture that has at least a minimum area necessary to conserve radiance for the emission beam angle in air. The lenses in said series of lenses are configured, in combination, to successively reduce a beam angle of light from the first beam angle to the emission beam angle.

21 Claims, 20 Drawing Sheets

(56) References Cited

U.S. PATENT DOCUMENTS

| | | |
|---|---|---|
| 8,152,317 B2 | 4/2012 | Okamoto et al. |
| 8,351,122 B2 | 1/2013 | Teijido et al. |
| 8,403,527 B2 | 3/2013 | Brukilacchio |
| 8,632,216 B2 | 1/2014 | Duong et al. |
| 2005/0007767 A1 | 1/2005 | Fischer et al. |
| 2005/0073849 A1 | 4/2005 | Rhoads et al. |
| 2006/0044523 A1* | 3/2006 | Teijido et al. .................. 353/53 |
| 2007/0012934 A1* | 1/2007 | Abu-Ageel ..................... 257/95 |
| 2007/0133200 A1* | 6/2007 | Uke et al. ...................... 362/202 |
| 2007/0152230 A1* | 7/2007 | Duong et al. .................. 257/98 |
| 2007/0215891 A1 | 9/2007 | Dahl et al. |
| 2007/0274068 A1 | 11/2007 | Berben et al. |
| 2008/0030974 A1 | 2/2008 | Abu-Ageel |
| 2009/0201677 A1* | 8/2009 | Hoelen et al. ................. 362/231 |
| 2009/0315051 A1* | 12/2009 | Wu et al. ......................... 257/98 |
| 2011/0128742 A9* | 6/2011 | Yuen et al. ..................... 362/294 |
| 2012/0106191 A1 | 5/2012 | Duong et al. |

OTHER PUBLICATIONS

International Search Report and Written Opinion for International Patent Application No. PCT/US2011/053085, mailed Jan. 20, 2012, Patent Cooperation Treaty, 8 pgs.

Notice of Allowance for U.S. Appl. No. 13/243,857, mailed Sep. 16, 2013, 6 pgs.

Office Action issued for U.S. Appl. No. 13/243,857, mailed Apr. 5, 2013, 10 pages.

International Preliminary Report on Patentability issued for PCT Application No. PCT/US2011/052993, mailed Apr. 4, 2013, 8 pages.

International Preliminary Report on Patentability issued for PCT Application No. PCT/US2011/053085, mailed Apr. 4, 2013, 7 pages.

\* cited by examiner

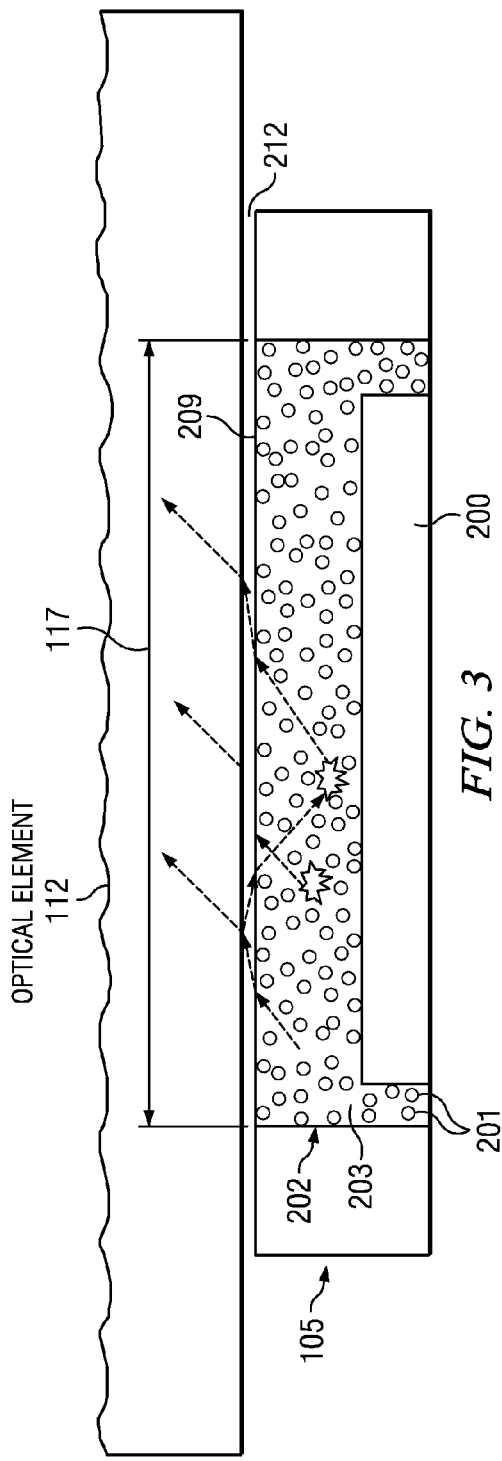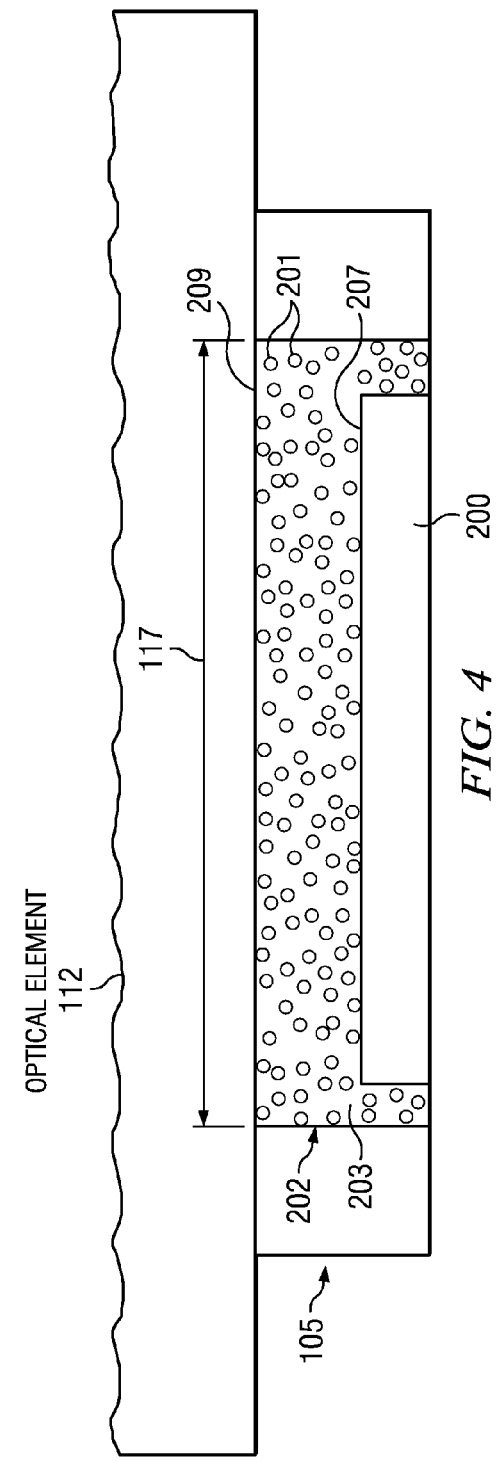

FIG. 23

| SURF:TYPE | COMMENT | RADIUS | THICKNESS | GLASS | SEMI-DIAMETER | CONIC |
|---|---|---|---|---|---|---|
| OBJ | STANDARD | INFINITY | 1.0000E-003 | | 1.1597 | 0.0000 |
| 1* | STANDARD | INFINITY | 5.9500 | PMMI | 3.0000 U | 0.0000 |
| 2* | EVEN ASP… | 15.3190 V | 8.5000 V | PMMA | 8.0000 U | 0.3360 V |
| 3* | EVEN ASP… | -7.5560 | 0.5000 | | 8.0000 U | -0.4270 V |
| 4* | EVEN ASP… | 1173.5520 V | 6.5000 V | PMMA | 11.5000 U | 0.0000 |
| 5* | EVEN ASP… | -15.7840 V | 5.0000 V | | 11.5000 U | -1.0990 V |
| STO | STANDARD | INFINITY | 1.0000E+004 | | 10.8935 | 0.0000 |
| IMA | STANDARD | INFINITY | - | | 1047.7471 | 0.0000 |

| SECOND ORDER TERM | FOURTH ORDER TERM | SIXTH ORDER TERM | EIGHTH ORDER TERM | TENTH ORDER TERM | TWELFTH ORDER TERM |
|---|---|---|---|---|---|
| 0.0000 | 0.0000 | 0.0000 | 0.0000 | 0.0000 | 0.0000 |
| 0.0000 | -1.187E-004 V | -8.134E-007 | 0.0000 | 0.0000 | 0.0000 |
| 0.0000 | -1.664E-004 | 1.0760E-006 | 0.0000 | 0.0000 | 0.0000 |
| 0.0000 | -1.599E-004 V | 1.4130E-006 V | -1.941E-008 V | 8.6490E-011 V | 0.0000 |

HIGH NA OPTICAL SYSTEM AND DEVICE

RELATED APPLICATIONS

This application claims priority under 35 U.S.C. §119(e) to U.S. Provisional Patent Application No. 61/386,050, entitled "High NA Refractive LED Secondary Optic," to Duong, filed Sep. 24, 2010, U.S. Provisional Patent Application No. 61/406,503, entitled "High NA Refractive LED Secondary Optic," to Duong, filed Oct. 25, 2010, U.S. Provisional Patent Application No. 61/479,661, entitled "High NA Refractive LED Secondary Optic," to Duong et al., filed Apr. 27, 2011, and U.S. Provisional Patent Application No. 61/487,511, entitled "LED Homogenizer" to Duong, filed May 18, 2011, each of which is fully incorporated by reference herein.

TECHNICAL FIELD

Embodiments described herein are related to optics for directing light into a desired beam angle. More particularly, embodiments described herein are related to using high numerical aperture ("NA") optics to project light from a light source into a narrow beam angle.

BACKGROUND

Various solutions have been attempted to direct light into a desired beam angle. Condenser lenses have been used in the illumination industry to collect light for centuries. The drawback of condenser lenses is that they have relatively low collection NA. As LEDs have become more prevalent in the illumination industry, new optics have been developed to shape the light beam. The majority of these rely on reflection to control the light distribution. Whether the reflection is off a metal (Ag, Al, alloy, etc) or because of total internal reflection ("TIR"), the optic relays the source aperture to a virtual or physical plane. Other systems use a combination of reflective, refractive and/or diffusing elements to control distribution.

Narrow full beam angles are difficult to achieve. U.S. patent application Ser. No. 12/788,094, which is hereby fully incorporated by reference herein, describes a reflective optic that exhibits superior beam shaping capabilities and higher efficiencies in a small package. However, in order to achieve high efficiencies at narrow beam angles, the reflective optic becomes relatively large. This may be undesirable in some applications.

Therefore, a small, efficient optic for projecting light into narrow beam angles is needed.

SUMMARY

Embodiments described herein provide an optical system to create a high collection NA imaging optic that projects the emitted photons into the desired intensity distribution while reimaging the entrance aperture. The optical system's exit aperture (area over which the optical system emits light) is derived from the brightness equation. The optical power of the system is determined by the number of elements and the curvature of each element. The overall height of the optical stack is a function of the number of elements and optical power of the system.

Conservation of radiance limits the minimum size of an optic's exit aperture for a given source brightness and for a desired emission angle. While the exit aperture is preferably at least some minimum size to conserve radiance, the height of the optic can be manipulated through the selection of lenses. By utilizing multiple optical elements, embodiments described herein offer an optical solution that can conserve brightness and project light into a narrow beam angle with a relatively low height and system volume.

According to one embodiment, an optical system to emit light in an emission beam angle is provided. The optical system comprises an LED and a high numerical aperture multi-element optical stack. According to one embodiment, the multi-element optical stack can be a multi-element optical stack that reimages the entrance aperture of the optical stack in far field.

The multi-element optical stack can include a number of optical elements forming a series of lenses. The series of lenses comprises, a first lens positioned to receive light emitted in a first beam angle and a second lens more distal from the LED than the first lens, the second lens defining a second lens exit aperture that has at least a minimum area necessary to conserve radiance for the emission beam angle in air. The lenses in said series of lenses are configured, in combination, to successively reduce a beam angle of light from the first beam angle to the emission beam angle. The lenses in said series of lenses can be configured, in combination, to emit in the emission beam angle at least 80% of the light entering the multi-element optical stack.

The series of lenses can comprise additional lenses, such as one or more intermediate lenses between the first lens and the second lens. In one such embodiment, the first lens reduces the beam angle of light from a first beam angle to a second beam angle, the intermediate lens reduces the beam angle of light from the second beam angle to a third beam angle and the second lens reduces the beam angle from the third beam angle to the selected beam angle. The lenses can have a variety of spacings and configurations.

The optical system can also include a homogenizer having an entrance face and a set of sidewalls extending from the entrance face to a distal end of the homogenizer. The entrance face of the homogenizer can be separated from the LED by an air gap. The distal end of the homogenizer can be located at an entrance surface to the first lens. The homogenizer can have a straight optical axis aligned with the optical axis of the first lens. The area of the distal end of homogenizer may be substantially smaller than the entrance surface of the first lens.

The homogenizer can have an entrance face (physical or virtual) of a first shape and a exit face (physical or virtual) of a second shape with the sidewalls of the homogenizer transitioning from the first shape to the second shape (e.g., from a square to a circle). In one embodiment, the sidewalls of the homogenizer can comprise a set of facets corresponding to the shape of the entrance face and one or more additional sets of facets corresponding to one or more transition shapes. In a particular embodiment, the sidewalls comprise a set of facets corresponding to a square shape and a set of facets corresponding to a hexadecagon shape. Preferably, the half angle of light exiting the homogenizer is at least 80% to equal to the half angle of light entering the homogenizer.

Another embodiment can comprise an optical system to emit light in a selected emission beam angle, the optical system having an LED, a homogenizer and a high numerical aperture imaging multi-element optical stack having an entrance aperture and exit aperture. The multi-element optical stack comprises a series of lenses optically coupled to the homogenizer that are configured, in combination, to successively reduce a beam angle of light from a first beam angle to the emission beam angle and emit in the emission beam angle at least 70% of the light entering the multi-element optical stack.

According to one embodiment, the series of lenses comprise a first lens optically coupled to and axially aligned with the homogenizer and positioned to receive light from the homogenizer in the first beam angle. The series of lenses also comprise a second lens optically coupled to and axially aligned with the first lens and more distal from the LED than the first lens. The second lens can be configured to emit light in the emission beam angle. The second lens defines the exit aperture such that the exit aperture has at least a minimum area necessary to conserve radiance for the emission beam angle.

BRIEF DESCRIPTION OF THE FIGURES

A more complete understanding of various embodiments of optical systems and devices and the advantages thereof may be acquired by referring to the following description, taken in conjunction with the accompanying drawings in which like reference numbers indicate like features and wherein:

FIG. 3 provides a diagrammatic representation of one embodiment of positioning a lens relative to a source;

FIG. 4 is a diagrammatic representation of another embodiment of positioning a lens relative to a source;

FIG. 23 is a table for one embodiment of a lens prescription.

DETAILED DESCRIPTION

Figure 1:
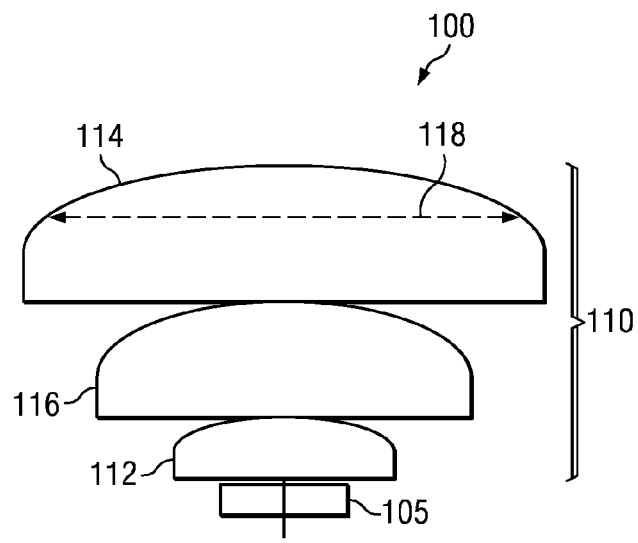
FIG. 1 is a diagrammatic representation of one embodiment of an optical system.

The disclosure and various features and advantageous details thereof are explained more fully with reference to the exemplary, and therefore non-limiting, embodiments illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited to only those elements but may include other elements not expressly listed or inherent to such process, product, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like. Furthermore, any dimensions, materials or other such characteristics are provided by way of example and not limitation.

Numerical aperture (NA) is a number that characterizes the range of angles over which an optical element can collect light. Embodiments described herein provide a multi-element imaging optical stack to collect light at high NAs (greater than 0.8 to approaching unity). The multi-element imaging optical stack relays an image from the entrance aperture to far field with a desired distribution. These results can be achieved with a small form factor, including the smallest form factor required to conserve brightness.

Figure 2:
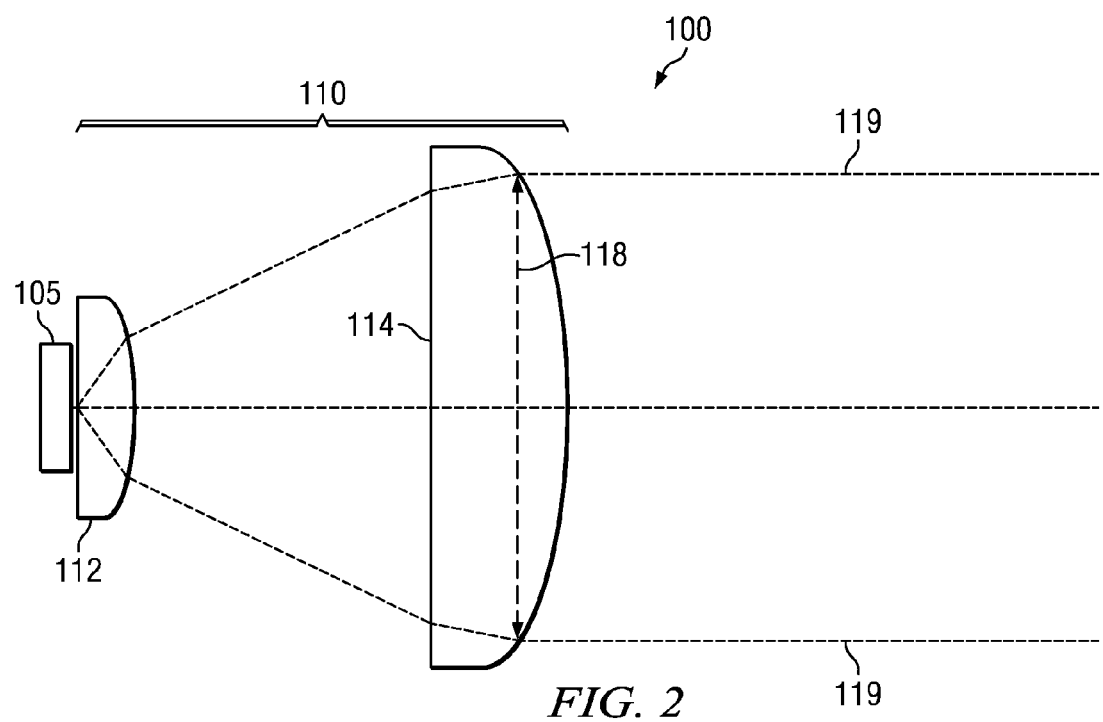
FIG. 2 is a diagrammatic representation of another embodiment of an optical system.

FIGS. 1 and 2 are diagrammatic representations of embodiments of optical systems 100 having a light source 105 used in combination with a multi-element imaging optical stack 110. In general, light source 105 is any component(s) that provide light to multi-element optical stack 110. Light source 105 may include, for example, LEDs or an array of LEDs used with or without phosphors. In this context, LED can refer to the LED chip with a cover, such as a dome, or the LED chip itself. In another example embodiment, light source 105 may be the end of a fibre optic cable or homogenizer that provides light or multi-element optical stack 110.

Multi-element optical stack 110 comprises a series of optical elements that form a series of lenses that act in combination to provide a high NA optical system that directs light into a controlled beam angle and relays an image of the entrance aperture of the multi-element optical stack into the far field.

The optical elements can be individual lenses or optical elements that form doublets, triplets or other lens structures.

In the embodiment of FIG. 1, multi-element optical stack 110 includes first lens 112 (the lens in multi-element optical stack most proximate to source 105), second lens 114 (the lens in multi-element optical stack 110 most distal from source 105) and intermediate lens(es) 116. According to one embodiment, the lenses are formed of clear plastic, glass or other optically transparent material. Lenses 112, 114 and 116 may have multiple refractive indexes and can have a variety of shapes including, but not limited to, spherical lenses, aspherical lenses, Fresnel lenses, diffractive lenses or combinations thereof. The lenses may be formed of the same or different materials and may contain coatings or scattering features. The optical system can use a variety of optical elements to control system aberrations. Each lens in multi-element optical stack 110 can be optically coupled to adjacent lenses or can be separated from adjacent lenses by a gap. Each lens has an optical axis (e.g., a line that defines the path along which light propagates through the lens). In general, though not necessarily, the optical axis of a lens is coincident with the rotational or mechanical axis of the lens. Preferably, the axes of the lenses in multi-element optical stack 110 are aligned with each other. Furthermore, light source 105 can be aligned with the optical axis of lens 112. In other embodiments, the source is not aligned with the optical axis to create a skewed distribution.

Each lens can have a lens entrance aperture and a lens exit aperture. The lens entrance aperture is the area over which light enters the lens and the lens exit aperture is area over which light exits the lens. The entrance aperture of first lens 112 is the entrance aperture of multi-element optical stack 110 and the exit aperture of second lens 114 is the exit aperture 118 of multi-element optical stack 110.

The optical stack is important to achieving high collection efficiency in the system (high NA). First lens 112 is in proximity of the source and can be formed in such a way that all the light from every point on the source passes through the lens. Multi-element optical stack 110 defines an exit aperture. (FIG. 2 illustrates the outer rays 119 projected by second lens 114), which can be selected so that for a given entrance aperture for multi-element optical stack 110, radiance is conserved in multi-element optical stack 110.

In order to conserve radiance, the size of exit aperture 118 of the system can be calculated using the Conservation of Radiance equations:

$$\frac{\phi}{n^2 A \Omega} = \frac{\phi'}{n'^2 A' \Omega'} \quad [\text{EQN. 1}]$$

$$A' = \frac{n^2 A \Omega}{n'^2 \Omega'} \quad [\text{EQN. 2}]$$

wherein $\Omega$ is the effective solid angle light enters, $\Omega'$ is the effective solid angle whereby light leaves multi-element optical stack 110, A is the area of the entrance aperture of multi-element optical stack 110, n is the refractive index into which the source emits, n' is the refractive index of material into which the optical stack emits.

Since the intensity distribution out of the exit aperture is typically in air, the n' value is approximately 1. Furthermore, if there is a gap between the source and optical device, n is also approximately 1. Since LEDs are extended sources, the value for $\Omega$ is $\pi$. With these conditions, the brightness equation reduces to:

$$A' = \frac{n^2 A \Omega}{n'^2 \Omega'} \quad [\text{EQN. 3}]$$

$$A' = \frac{A \pi}{\Omega'} \quad [\text{EQN. 4}]$$

Thus, for a projected beam angle of 10 deg, the solid angle is approximately $\pi \sin(5 \deg)^2$ for a circular beam. Methods for determining the solid angle for a square or rectangular beam are described in U.S. patent application Ser. No. 12/788,094, which is hereby fully incorporated by reference herein. For an initial entrance aperture of 1.5 mm×1.5 mm, the exit aperture has to be approximately 296 mm^2 to project all of the light into the 10 degree full beam angle (full width half maximum).

The above example assumes a source emission angle of pi steradians (solid angle), but in cases where the source emission angle is different, the equation still applies. For instance, if the source only emits into a 60 deg full cone, then A' is equal to A Pi( )/3/$\Omega'$.

The size of the exit aperture 118 can be selected based on conservation of radiance to achieve high efficiency. According to one embodiment, multi-element optical stack 110 can be formed so that exit aperture 118 is (within manufacturing tolerances) or is at least the size necessary to conserve radiance for a given system in a particular medium (e.g., air or other medium). In another embodiment, exit aperture 118 can be between 95-105% of the size necessary to conserve radiance. In other embodiment, the exit aperture 118 can be at least some percentage (e.g, 70%, 75%, 80%, 85%, 90% or 95%) of the size necessary to conserve radiance. Having a smaller exit aperture 118 reduces brightness. However, this may result in a desired intensity distribution yielding softer illumination edges. Thus, the selection of exit aperture can be made to balance size, profile and brightness.

In order for brightness to be conserved (or be within some percentage of being conserved) an appropriate amount of light must be relayed from each lens to the next. To relay light from first lens 112 to second lens 114, the projected beam angle of each lens can within the acceptance cone of the next more distal lens. According to one embodiment, the projected beam angle of a lens is smaller than the projected beam angle of light emitted by the next more proximal lens. Thus, for example, in FIG. 2, the projected beam angle of intermediate lens 116 can be less than that of first lens 112 and the projected beam angle half angle of second lens 114 can be less than that of lens intermediate lens 116.

To conserve radiance at each lens, the exit aperture of each lens can be selected based on the entrance aperture of that lens, the solid angle of light entering the lens and the solid angle of light exiting the lens. By selecting appropriate aperture sizes for each lens in multi-element optical stack 110, a series of lenses can be selected to successively reduce beam angle, while conserving radiance (or achieving other high transmission efficiency).

According to one embodiment, the multi-element optical stack can include a series of lenses that work in combination to relay approximately 100% or other percentage of light entering first lens 112 to far field. In some embodiments approximately 100%, or other high percentage (e.g., 70%, 75%, 80%, 85%, 90% or 95%) of the light entering lens 112 is relayed.

Furthermore, the lenses of multi-element optical stack 110 can work in combination to achieve a high percentage of light in beam. That is, for a given projected beam angle, a high percentage of the light emitted from second lens 114 is in that beam angle (e.g., greater than 70%, 75%, 80%, 85%, 90%, 95% or 98% of light in beam).

FIGS. 3 and 4, are diagrammatic representations of embodiments of positioning first lens 112 relative to source 105. In the embodiments of FIGS. 3 and 4, source 105 comprises LED chip 200 surrounded by phosphor particles 201 distributed in encapsulant 203 and disposed in cavity 202. In the embodiments of FIGS. 3 and 4, source 105 has a generally flat emitting surface (e.g., emitting plane 209, which in this case is parallel to the primary emitting face of the LED, represented at 207), though source 105 could have other shapes. The cavity can be defined by or lined with a reflective material, such as $TiO_2$ and can have a variety of shapes. The phosphor particles 201 can be disposed in the encapsulant 203, coated on top of the encapsulant, coated on the LED or otherwise disposed between LED 200 and the entrance face of first lens 112. The entrance aperture 117 (which indicates the object plane) of multi-element optical stack 110 is defined by exit aperture of the source, in this example, the cavity exit.

One difference between FIGS. 3 and 4 is that, in FIG. 3, first lens 112 is separated from the emitting surface of source 105 by an air gap 212, whereas, in FIG. 4, first lens 112 directly contacts the emitting surface of source 105 (i.e., the surface of the encapsulant). For purposes of the following discussion, the embodiment of FIG. 3 will be referred to as "non-coupled," while the embodiment of FIG. 4 will be referred to as "coupled." The use of the phrase "non-coupled," in this context, merely means that a gap exists between the exit aperture of source 105 and entrance face of first lens 112 (or homogenizer as illustrated in later embodiments), though the source and lens are still operatively coupled to source 105. In general, the size of the gap in the non-coupled solution can be selected so that the NA remains high relative to the source. By way of example, but not limitation, the gap is preferably less than 500 microns and can be approximately 100-200 microns.

Whether first lens 112 is coupled or non-coupled can affect the size of the exit aperture 118 of multi-element optical stack 110. The above example in which the exit aperture 118 was approximately 296 mm^2 for an entrance aperture of 1.5 mm×1.5 mm was for a configuration in which light entered first lens 112 from air. If the source of FIG. 4 emits directly into first lens 112, (assuming the encapsulant has a similar index of refraction as first lens 112) the size of the exit aperture 118 of multi-element optical stack 110 will increase by the refractive index of encapsulant 203 (i.e., $n^2$ as the source emits directly into encapsulant 203 before first lens 112). If the source is embedded into the first element, then the index of the first element would determine, in part, exit area necessary to conserve brightness as shown above in Equation 2. In other words, if the source aperture is emitting into a medium with a higher index of refraction than air, then the exit aperture has to increase to account for the index change.

While the non-coupled solution offers the advantage of a smaller exit aperture, the non-coupled solution may experience some losses. FIG. 3 illustrates several possible light paths that result in losses. At the phosphor to air interface, two events are possible. The ray refracts into air, with corresponding Fresnel reflection, or the light is reflected back into the encapsulant due to total internal reflection ("TIR"). Because phosphor is an ergodic system, rays that are reflected will have a probability of being scattered into a non-trapping mode. This continues until the light eventually escapes into the air interface between the phosphor and the optical element or is absorbed by the LED chip, the cavity walls, etc. Fresnel reflections at the phosphor to air interface will experience the same dynamics as the totally internally reflected light. At the air to optical element interface, the light may refract into the optical element. Fresnel reflections off this interface will experience the same dynamics as the totally internally reflected light. Therefore, according to one embodiment, the cavity walls, chips and everything within the cavity should be as non-absorptive as possible.

AR (anti-reflective) coatings may be beneficial on the exit face of the primary optical element (e.g., first lens 112) and any subsequent optical elements to reduce Fresnel reflections and increase system throughput. An AR coating at the entrance face of first lens 112 will be less beneficial unless the AR coating is omni-directional. A traditional multilayer coating reduces reflections over specific angles. Outside of these angles, the reflectivity increases. Since this interface contains light at all angles, traditional AR coatings may not be effective, though can be included if desired. Texturing, such as Motheye surface texturing, or other omni-directional method can be applied to any of the lens surfaces to reduce Fresnel reflections.

In the coupled solution, light will typically not experience TIR at the phosphor lens interface as the materials of first lens 112 and encapsulant 203 can be selected to prevent or reduce this phenomenon as well as Fresnel reflection. Thus, while the coupled solution may require a larger exit aperture, the coupled solution can be overall more efficient. It is estimated that the difference in total emitted flux between coupling and not coupling may be small (5-30%). The loss is dependent on the type of chip or the geometry of the source. Thus, the selection of a coupled or non-coupled system can depend on the tradeoffs between exit aperture size (system volume) and losses in total emitted flux.

Figure 5:
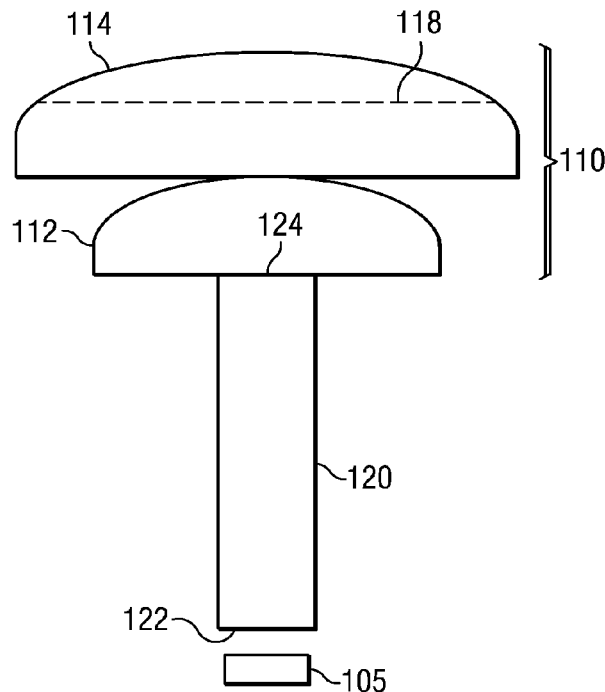
FIG. 5 is a diagrammatic representation of another embodiment of an optical system.

FIG. 5 is a diagrammatic representation of another embodiment of an optical system including light source 105 and a multi-element optical stack 110 having first lens 112 and a second lens 114 used in combination with a homogenizer 120. Homogenizer 120, according to one embodiment, transfers optical stack 110's high NA to source 105.

Homogenizer 120 includes an entrance face 122 that defines the entrance aperture of multi-element optical stack 110 and an exit face 124 (physical or virtual), which, if the homogenizer 120 and first lens 112 are a unitary piece, is a virtual exit face defined at the intersection of homogenizer 120 and first lens 112. According to one embodiment, exit face 124 is parallel to the primary emitting plane of light source 105, so that homogenized light is emitted in a plane parallel to the emitting plane of light source 105. Homogenizer 120 can have a variety of shapes such as tapered or untapered. According to one embodiment, the entrance face 122 of homogenizer 120 can have a different shape than the exit face 124.

In general, the purpose of a homogenizer is to allow light to bounce multiple times as it propagates along the homogenizer, causing spatial variation in the source to be reduced so that the flux at any point exiting the homogenizer is preferably very uniform. By way of example, but not limitation, homogenizer 120 can homogenize light so that the peak to valley variation in flux per unit area is less than 10% or other percentage (e.g., 5%).

According to the embodiment of FIG. 5, homogenizer 120 is a rectangular homogenizer with an exit face 124 at the plano surface of first lens 112. A homogenizer in which the entrance face 122 and exit face 124 have the same area does not alter the angular distribution of the light, just the spatial distribution. That is, the homogenizer essentially moves the source aperture but does not alter the angular distribution. However, if the exit face 124 is larger than the entrance face 122, the half angle of light leaving the exit face 124 will be smaller than the half angle of light entering entrance face 122. According to one embodiment, the shape of homogenizer can be selected so that the half angle of light emitted from the homogenizer at the physical or virtual exit face is from 80% to equal to the half angle of light entering homogenizer 120.

For a given entrance face 122 size, the exit aperture 118 of multi-element optical stack 110 can be determined from EQN. 1-4. Each lens 112 and 114 can be configured to successively reduce beam angle while conserving radiance to achieve the desired beam angle for multi-element optical stack 110.

Multi-element optical stack 110 can include imaging optics to relay an image from the entrance aperture of multi-element optical stack 110 to far field. Homogenizer 120 essentially relays an image from the entrance face 122 to the exit face 124.

Exit face 124 of homogenizer 120 and entrance face of lens 112 can be coupled together (e.g., as an integrated piece, using an optical adhesive or otherwise coupled) or can be separated by an air gap. When homogenizer 120 and first lens 112, the exit face 124 of homogenizer 120 can define the entrance aperture 117 of multi-element optical system 110. Optical stack 110 is arranged to have a high NA (e.g., an NA of greater than 0.8 to approaching unity). Consequently, multi-element optical stack 110 can have a high NA relative to source 105, even though multi-element optical stack 110 is, to some extent, remote from source 105.

Figure 6:
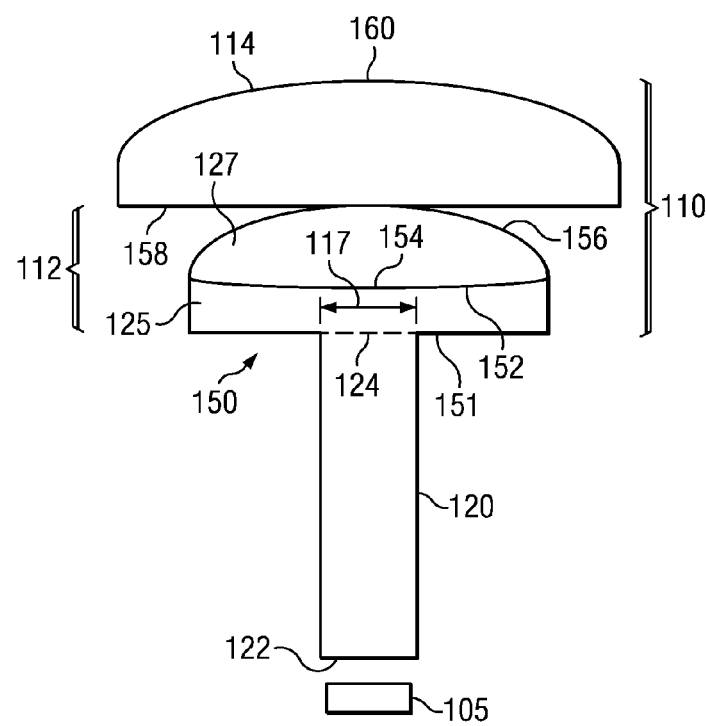
FIG. 6 is a diagrammatic representation of yet another embodiment of an optical system.
Figure 12:
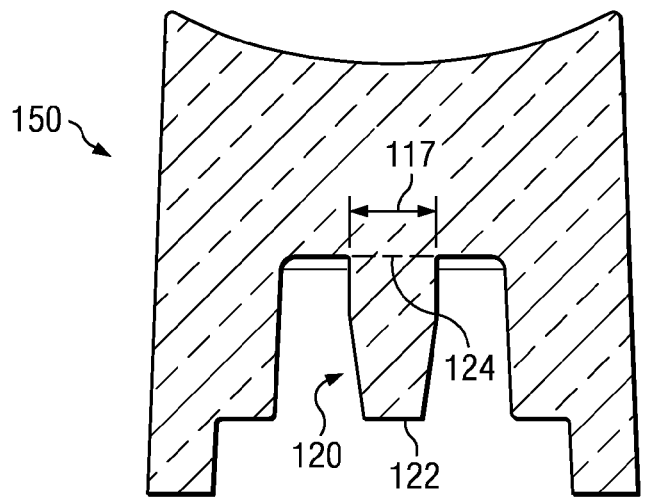
FIG. 12 is a diagrammatic representation of another embodiment of a homogenizer housing structure.

FIG. 6 is a diagrammatic representation of another embodiment of an optical system 100 having a light source 105, a multi-element imaging optical stack 110 and a homogenizer. According to one embodiment, multi-element optical stack 110 includes a first optical element 125, a second optical element 127 and a third optical element (represented as second lens 114). First lens 112, in this embodiment, is a doublet formed from optical element 125 and optical element 127. Optical element 125 and homogenizer 120 are integrated in a homogenizer housing structure 150 that includes optical element 125 portion and a homogenizer 120 portion. In the embodiment of FIG. 12, homogenizer 120 and optical element 125 are an integrated component, while optical elements 125 and 127 are coupled together (e.g., using optical adhesive or other joining mechanism). Entrance face 122 defines the entrance aperture of multi-element optical stack 110, while second lens 114 defines the exit aperture. Entrance face 122 of homogenizer 120 can be sized and positioned so that all or substantially all the light emitted by source 105 enters entrance face 122. The geometries of each lens 112, 114 (and, in one embodiment, each optical element of a lens) can be selected to successively reduce the beam angle of light from that received at entrance face 122 to a selected beam angle while conserving radiance.

In the embodiment illustrated in FIG. 6, optical element 125 comprises a first surface 151 facing source 105 and a second surface 152 on the opposite side of lens 112 (an "exit surface" 152). Surface 151 can be flat or have other desired shape. Exit surface 152 of first lens 112 is concave and compliments convex entrance surface 154 of optical element 127. The surface of optical element 127 on the opposite side of optical element 127 from the source (i.e., exit surface 156 (the exit surface of first lens 112)) is also convex. The surface of lens 114 facing the source (i.e., entrance surface 158) is slightly concave, while the surface of lens 114 facing away from the source (i.e., exit surface 160) is convex.

According to one embodiment, first optical element 125 and second optical element 127 are formed of materials that have a sufficient difference in abbe numbers to substantially reduce or eliminate visible color aberration. In some embodiments, optical element 125 may be manufactured with a low abbe number (for more dispersion) and optical element 127 may be manufactured with a high abbe number (for less dispersion). According to one embodiment, the abbe number of optical element 125 is under 30 and the abbe number of optical element 127 is above 50 so that the difference in abbe numbers is greater than 20, and even more preferably greater than 30, though other embodiments may use smaller differences. Furthermore, it is preferable that the material of homogenizer 120 have a softening temperature that is above the operating temperature of source 105, which can be around 150 C if phosphors are used. To meet these criteria, one embodiment includes a homogenizer 120 and optical element 125 formed of PMMI and an optical element 127 formed of acrylic. PMMI has a softening temperature of approximately 170 C and an abbe number of 22.97, while optical grade acrylic has a softening temperature near 85-95 C and an abbe number of 55.31. Lens 114 can be formed of a material having a similar abbe number as optical element 127.

The surfaces of the optical elements/lenses may be coated, textured or patterned to achieve desired results. For example, homogenizer entrance face 122, intermediate lens exit surface 156, second lens entrance surface 158 and/or second lens exit surface 160 can be coated with an AR coating or patterned with an AR pattern, such as moth eye. In one embodiment, surface 160 can be textured to provide more diffuse light. As another example, surfaces 156 and 160 can be patterned with diffractive optical elements. Diffractive optical elements (DOEs) are optical components that spatially vary a lens thickness to change the optical path length that the wavefront experiences at various points along a lens. DOEs are typically patterned micro-structures on the surface of a lens. In one embodiment, a DOE is selected to control color, such as for reducing blue-red separation or chromatic aberration.

FIGS. 7-12 are diagrammatic representations of one embodiment of an optical device 161 comprising an LED housing 162, a homogenizer housing structure 150, a lens housing 164 and second lens portion 155. Optical device 161 incorporates an embodiment of the optical system of FIG. 6, with homogenizer housing structure 150 having a homogenizer 120 portion and a first optical element 125 portion and lens housing 164 integrating second optical element 127. Optical element 125 and optical element 127 are arranged as a doublet to form first lens 112.

LED housing 162 defines a cavity 166 (see FIG. 8) in which an LED chip is disposed. The base of cavity 166 can be formed by a heat sink 168, such as a copper plug or other heat sink that passes through LED housing 162. A set of alignment walls 170 extending upwards from around the edges of the cavity can aid in aligning the homogenizer 120 over the LED with an air gap between the LED and entrance face 122 of homogenizer 120. According to one embodiment, the opening to cavity 166 and homogenizer 120 are approximately the same size.

LED housing 162 can also include alignment features to help ensure homogenizer housing structure 150 is properly aligned with LED housing 162. As one example, LED housing 162 can include bosses 172 extending from the upper surface of LED housing 162 that are received by corresponding cavities in homogenizer housing structure 150.

Homogenizer housing structure 150 comprises a portion forming optical element 125, a portion forming homogenizer 120 and a support member 174 formed of unitary piece of material or multiple parts coupled together. Optical element 125 comprises a first surface 151 facing source 105 and a second surface 152 on the opposite side of optical element 125 (an "exit surface" 152). Surface 152 is concave with a geometry such that light optical element 127 in the acceptance angle of optical element 127. Surface 151 can be flat or have other desired shape.

Homogenizer 120 extends from surface 151 to entrance face 122, preferably parallel to and coaxially with the optical axis of lens 112. Homogenizer 120 can be straight or tapered and may be configured to shape light into a square, rectangle, circle or other shape (including arbitrary images and letters).

Homogenizer housing structure 150 can further include a support member 174, such as an annular wall, extending from surface 151 to LED housing 162. Support member 174 can include boss receiving cavities 176 to receive bosses 172. Support member 174 creates a homogenizer cavity 177 around homogenizer 120. Typically, the cavity will be filled with air to promote TIR in homogenizer 120, though other medium may be used.

Lens housing 164, according to one embodiment, forms an integrated housing and optical element 127. Lens housing 164, in the embodiment of FIG. 5, is shaped to form a first cavity 178 (the "lens cavity") and a second cavity 180 (the "doublet cavity") (see FIGS. 10A and 10B) on obverse sides of optical element 127. Lens cavity 178 is defined by cavity walls 182 and a cavity base surface 184 that extends across the base of cavity 178. Cavity walls 182 extend upward from base surface 184 in a direction away from LED housing 162. The ends of cavity walls 182 are spaced so that lens 114 can rest with surface 158 of lens 114 contacting surface 156 of lens 116 or separated from surface 156 a selected distance. Thus, lens housing 164 can be used to set the focus of optical device 161. Additionally, cavity walls 182 can be spaced from the edge of lens 116 so that all or substantially all the light projected from optical element 127 can enter lens 114 without hitting the cavity walls 182.

Housing support member 186 extends from base surface 184 toward LED housing 162. According to one embodiment, housing support member 186 can comprise an annular wall that partially defines doublet cavity 180. Doublet cavity 180 is shaped to receive homogenizer housing structure 150 so that concave first lens exit surface 152 contacts entrance surface 154 of optical element 127 (the surface of optical element 127 facing the source).

Lens housing 164 can include features corresponding to alignment features of homogenizer housing structure 150. For example, lens housing 164 can include alignment recesses 188 to receive extensions 190 of homogenizer housing structure 150. Preferably, the corresponding alignment features provide a mechanism to axially optical element 125 with optical element 127.

Figure 7:
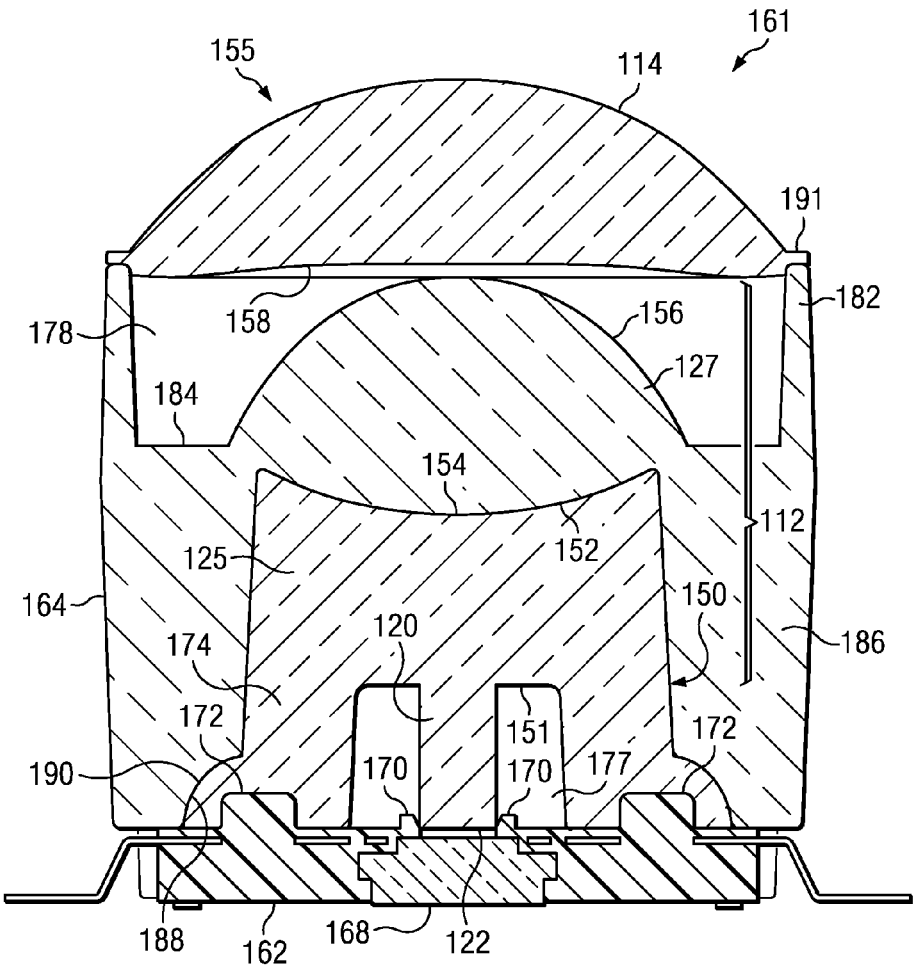
FIG. 7 is a diagrammatic representation of one embodiment of an optical device.

Second lens portion 155 of FIG. 7 includes lens 114 having a slightly concave surface 158 on one side and a convex surface 160 on the other side. Additionally, second lens portion 155 includes an annular flange 191 extending outward from lens 114 perpendicular to the optical axis of second lens 114. Flange 191 can rest on cavity wall 182 or other shoulder defined by lens housing 164. In other embodiments, lens 114 can be supported by other mechanisms, such as discontinuous tabs that extend outward. A portion of lens 114 extends downward from flange 191 to overlap the inside of cavity wall 182. This can aid in aligning lens 114 so that lens 114 is axially aligned with lens 112. Adhesive can be used to join second lens portion 155 to lens housing 164.

Figure 8:
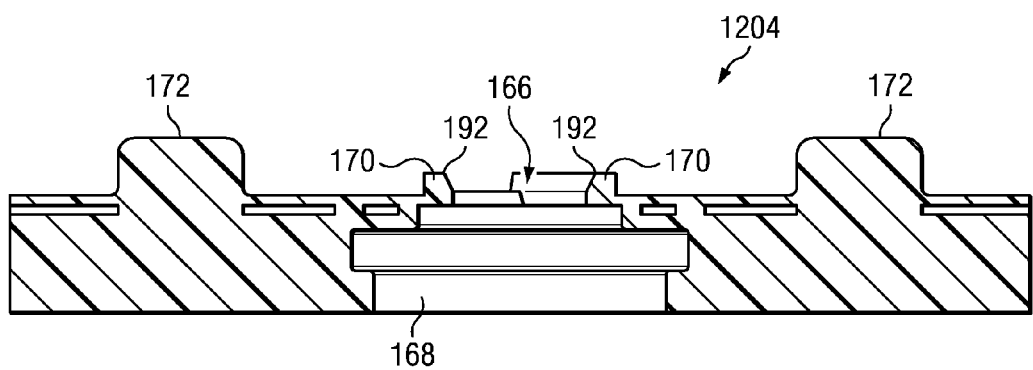
FIG. 8 is a diagrammatic representation one embodiment of an LED housing.

FIG. 8 is a diagrammatic representation of another view of one embodiment of LED housing 162. As illustrated in FIG. 7, the inside surfaces 192 of alignment walls 170 can be tapered so that homogenizer 120 settles in the proper position. The walls can be shaped so that homogenizer 120 is separated from the LED by a small gap.

Figure 9A:
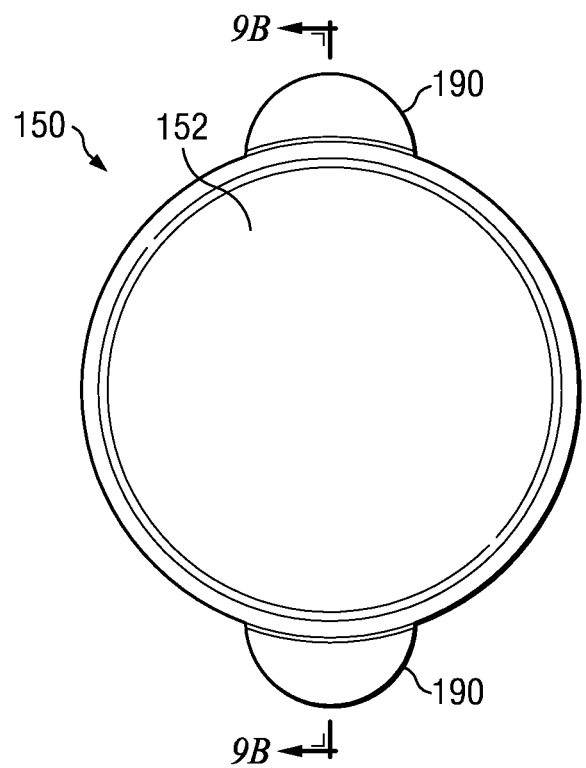
FIGS. 9A-D are diagrammatic representations of one embodiment of a homogenizer housing structure.
Figure 9B:
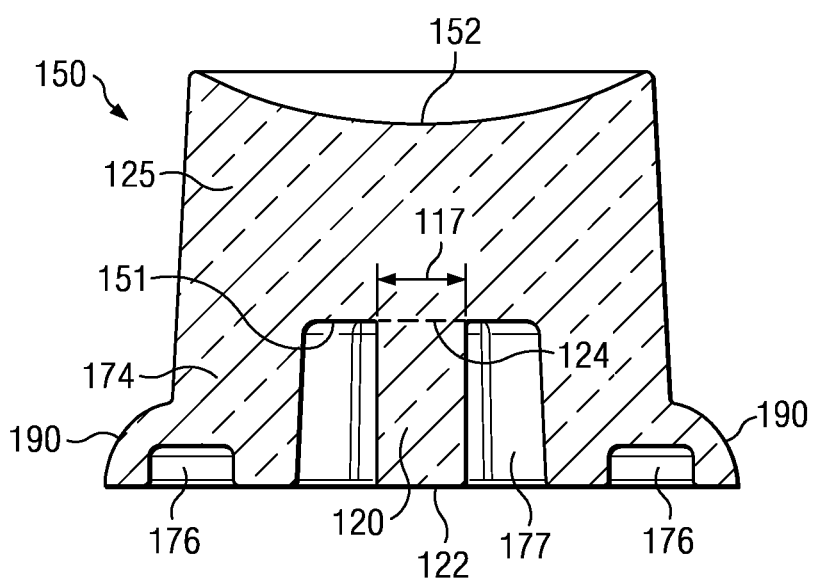
Figure 9C:
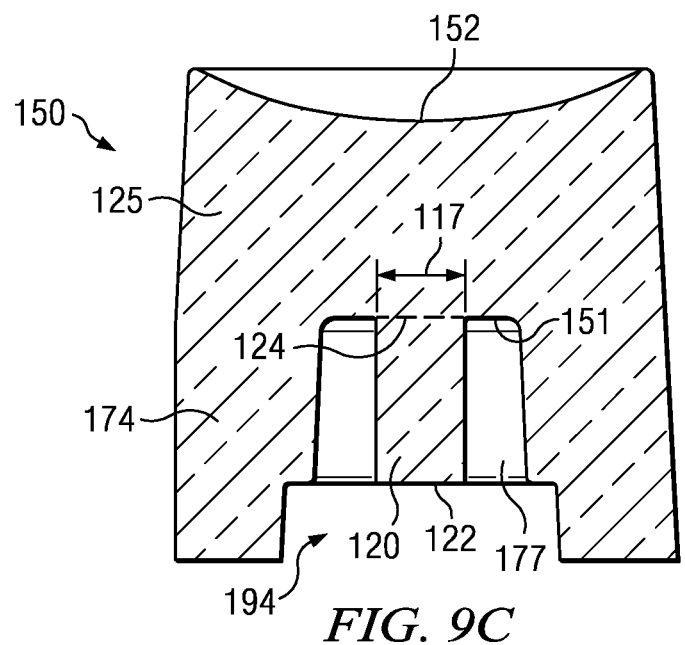
Figure 9D:
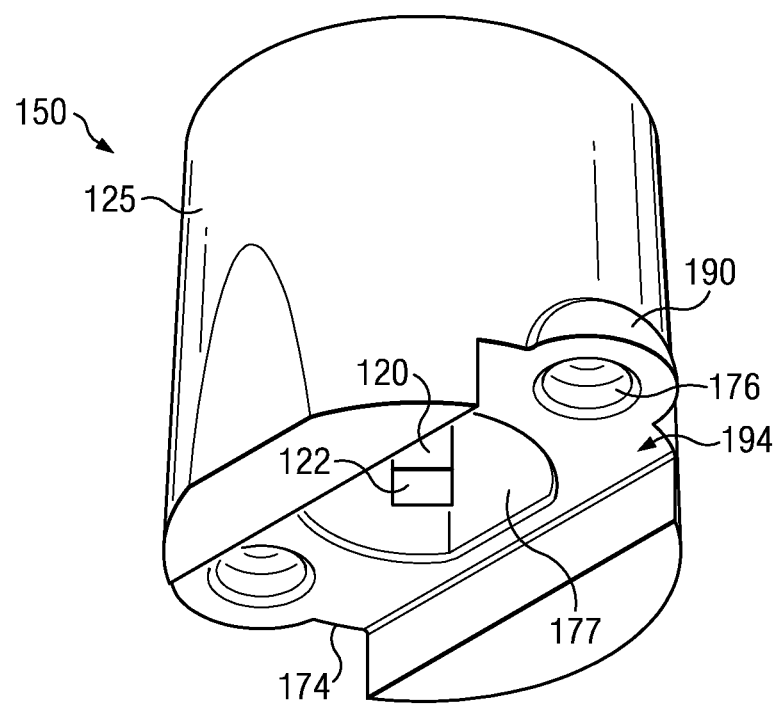

FIGS. 9A-D are diagrammatic representations of one embodiment of homogenizer housing structure 150. FIG. 9A is a view of homogenizer housing structure 150 looking into exit face 152 of optical element 125, FIG. 9B is a cross-section along line B-B of FIG. 9A and FIG. 9C is a cross-section along line A-A of FIG. 9A.

According to one embodiment, homogenizer housing structure comprises 150 a generally cylindrical structure extending from a first end to a second end. Homogenizer housing structure 150 may taper outward from the first end to the second end. A surface 152 at the first end defines the exit face of optical element 125 and acts as a refractive surface to emit light in a selected beam angle. At the second end, the homogenizer housing structure defines a passage 194 open at the second end of the homogenizer housing structure 150 and extending across the homogenizer housing structure lateral to the optical axis of homogenizer housing structure 150. Lateral passage 194 can be sized to accommodate the width of LED housing 162. Homogenizer housing structure 150 further defines homogenizer cavity 177 open to lateral passage 194 and extending a distance into the homogenizer housing structure surface 151 that, in this embodiment, extends generally lateral to the optical axis of homogenizer housing structure 150. Generally lateral surface 151 extends laterally from an annular sidewall (e.g., support member 174) to homogenizer 120.

Homogenizer housing structure 150 further comprises homogenizer 120 extending a length parallel to the optical axis from lateral surface 151 a distance to homogenizer entrance face 122, defined in a plane perpendicular to the optical axis. Homogenizer 120 transitions into lens 112, which extends from surface 151 to the exit face 152 of the optical element 125.

Homogenizer housing structure 150 further comprises extensions 190 extending laterally outward from the annular sidewalls of homogenizer housing structure 150. Extensions 190 can be in-line with lateral passage 194. Extensions 190 can include a curved outer surface or other shaped surface.

Homogenizer housing structure 150 can also define boss receiving cavities 176 that extend into homogenizer housing structure 150 from the second end. Boss receiving cavities 176 can be shaped to receive bosses 172 of LED housing 162. Boss receiving cavities 176 may be partially defined in extensions 190.

Figure 10B:
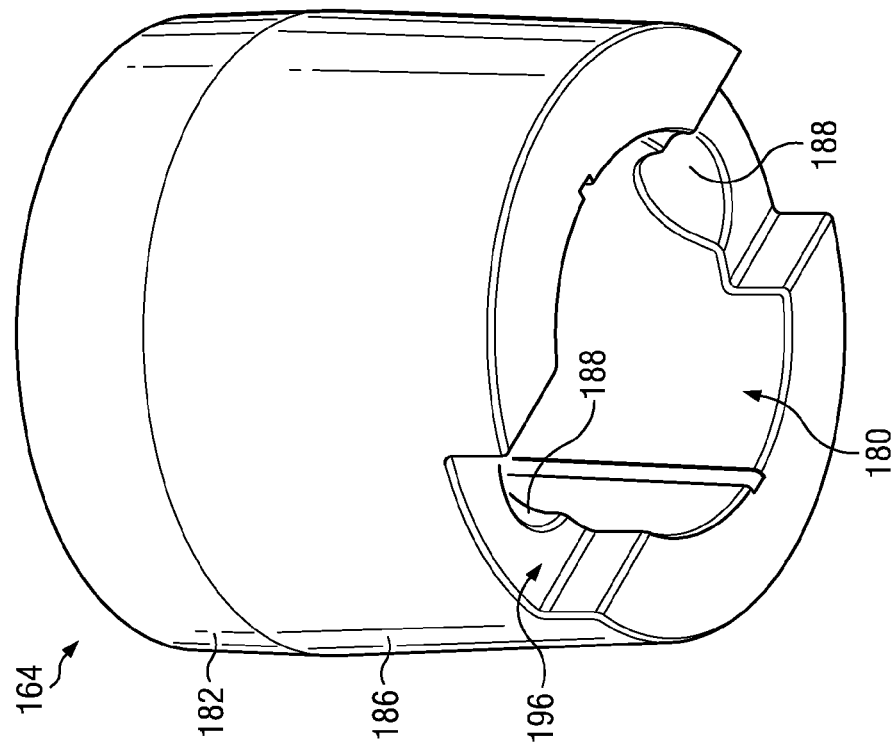
FIGS. 10A-C are diagrammatic representations of one embodiment of a lens housing.
Figure 10A:
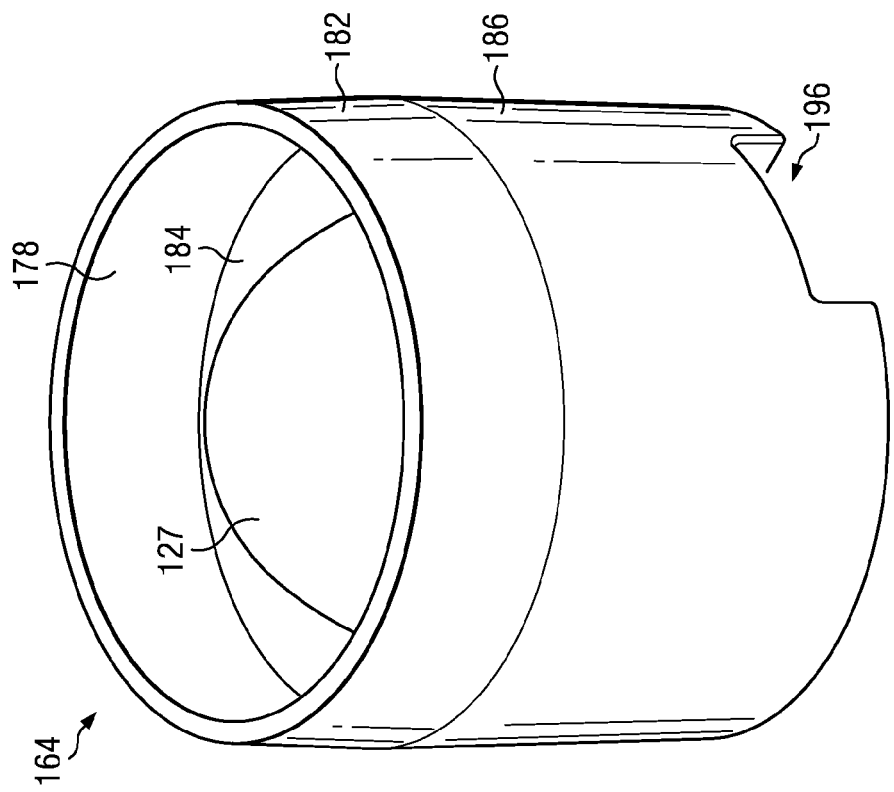
Figure 10C:
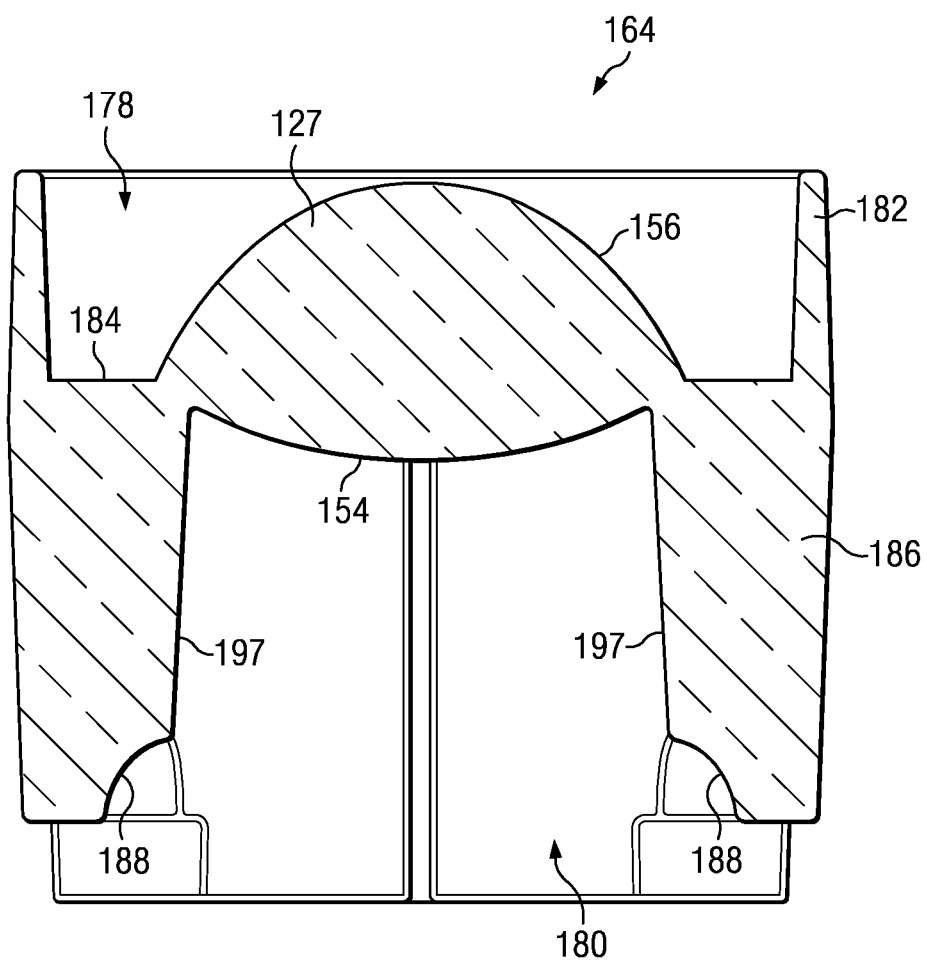

FIGS. 10A-C are diagrammatic representations of one embodiment of lens housing 164. According to one embodiment, lens housing 164 can comprise a generally cylindrical shape extending from a first end to a second end. Lens housing 164 defines a lens cavity 178 open to the first end. The sides of the lens cavity can be defined by an annular lens cavity sidewall 182 that extends from the first end to a surface to a lens cavity base 184. Lens cavity base 184 can include a first portion that extends inwardly from the sidewall 182, perpendicular to the optical axis, and a second portion that is shaped to form the refractive optical surface that acts as exit surface 156 of optical element 127.

At the second end, lens housing 164 defines a passage 196 open at the second end of lens housing 164 and extending across lens housing 164 lateral to the optical axis of lens housing 164. Lens housing lateral passage 196 can be sized and shaped to accommodate the width of the LED housing. Lens housing 164 further defines a homogenizer housing structure cavity 180 open to lateral passage 196 and extending a distance into the lens housing parallel to the optical axis. According to one embodiment, the homogenizer housing structure cavity is defined by an annular sidewall (e.g., support structure 186) and a surface that acts as the entrance surface 154 of lens 116. Homogenizer housing structure cavity 180 can be shaped and sized to accommodate homogenizer housing structure 150, such that surface 154 of optical element 127 abuts surface 152 of optical element 125 and optical element 125 and optical element 127 are axially aligned. Additionally, lens housing 164 defines recesses 188 extending laterally outward from homogenizer housing structure cavity 180 to receive extensions 190 (or other alignment feature) of homogenizer housing structure 150 to align lens housing 164 relative to homogenizer housing structure 150.

In the embodiment of FIGS. 10A-10C, housing support member 186 is formed by an annular wall. In other embodiments, housing support member 186 can comprise legs or other structures. The inner surfaces 197 of housing support member 186 that define homogenizer housing structure cavity 180 can taper outwards such that the width of homogenizer housing structure cavity 180 is greater proximate to the LED than at optical element 127.

According to one embodiment, lens housing 164 and homogenizer housing 150 and lens housing 164 can be coupled together using adhesive between surfaces 152 and 154. Lens housing 164 can include one or more channels (illustrated as a vertical channel in FIG. 10C) running along the walls of homogenizer cavity 180 from the end proximate to the source to the end distal from the source. The channels can provide a route for excess adhesive and bubbles to evacuate when surfaces 154 and 152 are coupled together. The channels help minimize adhesive thickness and bubbles.

Figure 11:
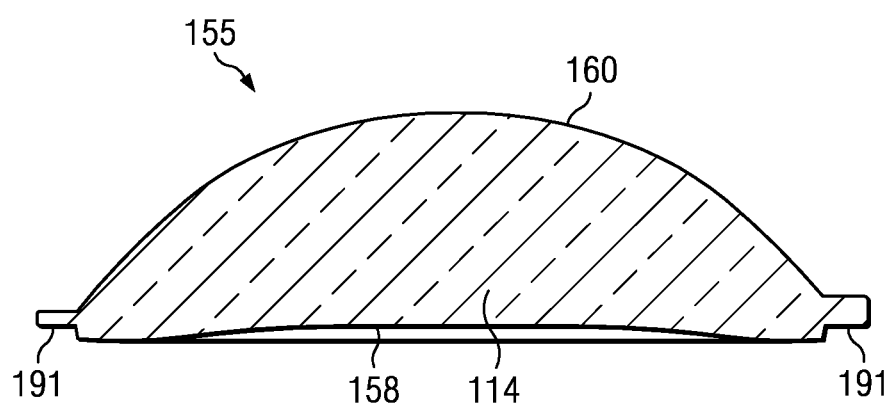
FIG. 11 is a diagrammatic representation of one embodiment of a lens structure.

FIG. 11 is a diagrammatic representation of one embodiment of second lens portion 155 having lens 114 with an annular flange 191 extending radially outward at the sides of lens 114. Lens 114, in the embodiment of FIG. 11, includes a concave entrance surface 158 and convex exit surface 160.

In the embodiments of FIGS. 7-11, lens 112 and 114 are imaging lenses, meaning that they relay the image from the entrance aperture of lens 112 (the virtual exit face of homogenizer) to far field. Furthermore, because the entrance and exit faces of homogenizer 120 are the same, homogenizer 120 relays the image from entrance face 122 to the virtual exit face 124, meaning that the image at entrance face 122, typically the image of the source, is reimaged in far field, but with spatial variation homogenized. Furthermore, homogenizer 120 is positioned to have a high NA relative to the LED chip (or other source) and all the light emitted by homogenizer 120 is collected by optical stack 110.

FIG. 12 is a diagrammatic representation of another embodiment of homogenizer housing structure 150. The embodiment of FIG. 12 is similar to that of FIGS. 9A-D, except that homogenizer 120 is configured such that exit face 124 has a different shape than entrance face 122. In the embodiment of FIG. 12 homogenizer 120 is configured to convert a square illumination pattern into a circular illumination pattern. In this case, multi-element optical stack 110 will reimage in far field what appears at the entrance aperture 117 (i.e., what appears at the virtual exit face 124 of homogenizer 120).

Figure 13A:
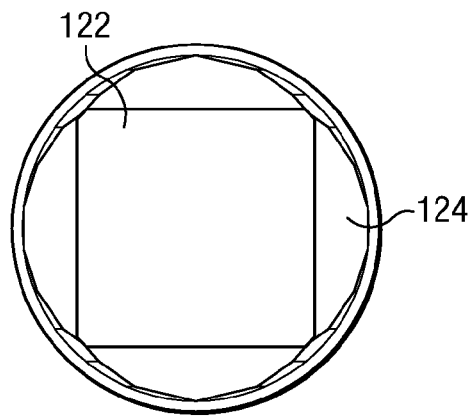
FIGS. 13A-B are diagrammatic representations of one embodiment of a homogenizer.
Figure 13B:
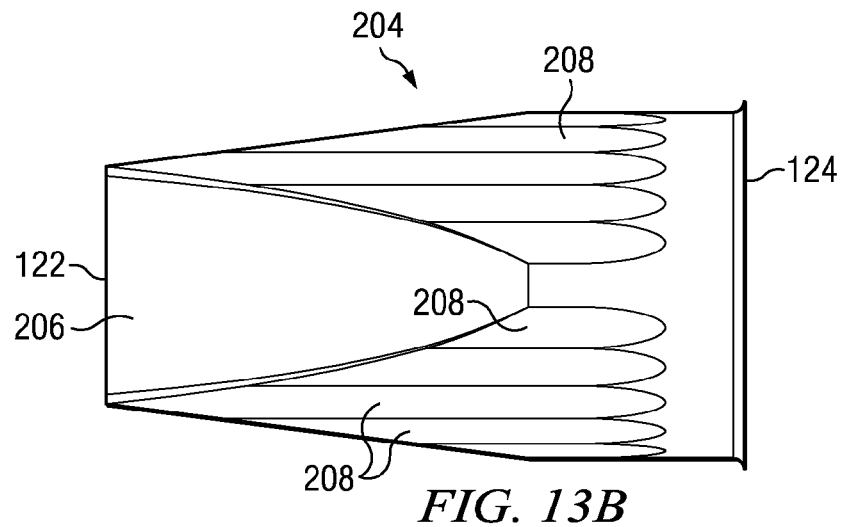

FIGS. 13A-B are diagrammatic representations of one embodiment of a homogenizer 120 for converting from a square to circular illumination pattern. FIG. 13A is view of homogenizer 120 looking at entrance face 122 and FIG. 13B is a diagrammatic representation of a side view of homogenizer 120. Homogenizer 120, in FIGS. 13A-B, comprises entrance face 122, exit face 124 and sidewall(s) 204 extending from entrance face 122 to exit face 124. The shape of exit face 124 is selected to have at least the same area as entrance face 122. In this example, the diameter of exit face 124 is approximately equal to the diagonal of entrance face 122, making exit face 124 slightly larger than entrance face 122. Because of the difference in shape, sidewalls 204 are slightly tapered.

The sidewalls 204 of homogenizer 120 are shaped to transition from the shape of the entrance face to the shape of the exit face (e.g., from a square entrance face 122 to a round exit face 124 or between other geometric or arbitrary shapes). The sidewalls 204 comprise multiple sets of facets, curves or other transition features. According to one embodiment a first set of facets 206 correspond to a shape of the entrance face while a second set of facets 208 correspond to a transition shape between the shape of entrance face 122 and exit face 124 (that is, a shape that begins to more closely approximate the shape of exit face 124). Additional sets of facets can correspond to any number of other shapes between the shape of entrance face 122 and exit face 124. In the embodiment of FIGS. 13A-13B, facets 206 correspond to a square shape and facets 208 correspond to a hexadecagon.

The shape of homogenizer 120 can be formed using a base shape having the appropriate size and shape for exit face 124. For the example of FIGS. 13A-13B, the base shape is a cylinder. Facets 206 are formed based on an extruded cut made with the shape of the entrance face 122, with the cut tapering outward along a defined angle. Thus, facets 206 correspond to a square shape extruded cut (regardless of whether homogenizer 120 is actually formed by cutting, molding or some other process). Even more specifically, in the example of FIGS. 13A-13B, facets 206 correspond to a square shape making an extruded cut with a taper angle 7.25 degrees such that the entrance face 122 has the desired shaped and size and the sidewalls taper outwards. Facets 208 are formed based on an extruded cut made using a hexadecagon with a taper angle of 1 degree.

In other embodiments, facets can correspond to other shapes. For example, to transition from a square to a circle, facets can be formed based on extruded cuts using hexagonal, octagonal and or other shapes. The sidewalls 204 may include any number of different sets of facets formed based on any number of shapes between the shape of entrance face 122 and exit face 124.

Furthermore, while in the embodiment of FIGS. 13A-13B the transition features are formed based on straight extrusion cuts corresponding to geometric shapes, other embodiments can include transition features corresponding to arbitrary shapes. Furthermore, the transition features may include simple or complex curves to transition from the shape of entrance face 122 to exit face 124.

In one embodiment, a homogenizer that transitions from a first shape to a second shape can be modeled in a 3-D modeling program such as SOLIDWORKS by Dassault Systemes SolidWorks Corp. of Concord Mass. and the resulting shape can be entered in a ray tracing program, such as ZEMAX by Radiant ZEMAX LLC of Bellevue, Wash. Ray tracing can be performed to determine the flux per unit area given by a particular shape. Iterative adjustment of the shape can be performed until a satisfactory output is determined. Preferably, the homogenizer is selected so that the difference in half angle of light emitted from exit face 124 and the half angle of light entering homogenizer 120 is less than 20%. Furthermore, the homogenizer is preferably configured so that the peak to valley difference of flux per unit area of light emitted is less than 10%.

With or without a homogenizer, various embodiments of optical systems can be configured so that greater than 75%, including greater the 95%, of the light entering lens 112 is projected into far field (referred to herein as transmission efficiency) in a desired beam angle (referred to as percent in beam), not counting Fresnel losses. However, even at lower transmission efficiencies and percent in beam, optical devices of the present application provide superior beam shaping capabilities. If a smaller percent in beam is desired, tradeoffs between the exit aperture and the percent in beam may also be made. Lenses can be formed to account for this tradeoff per the system requirement.

Figure 14A:
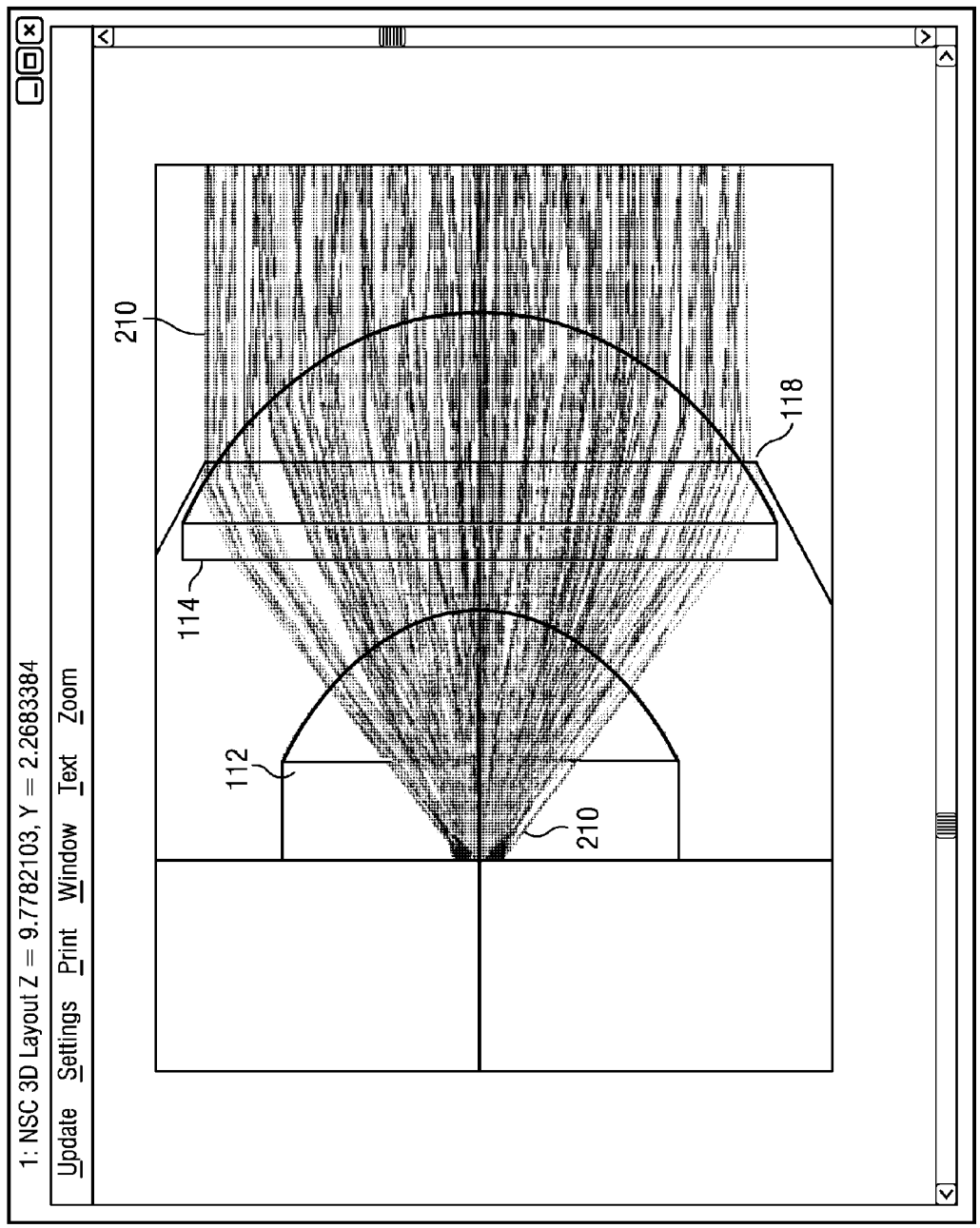
FIGS. 14A-B are diagrammatic representations of ray tracing models for one embodiment of an optical system.
Figure 14B:
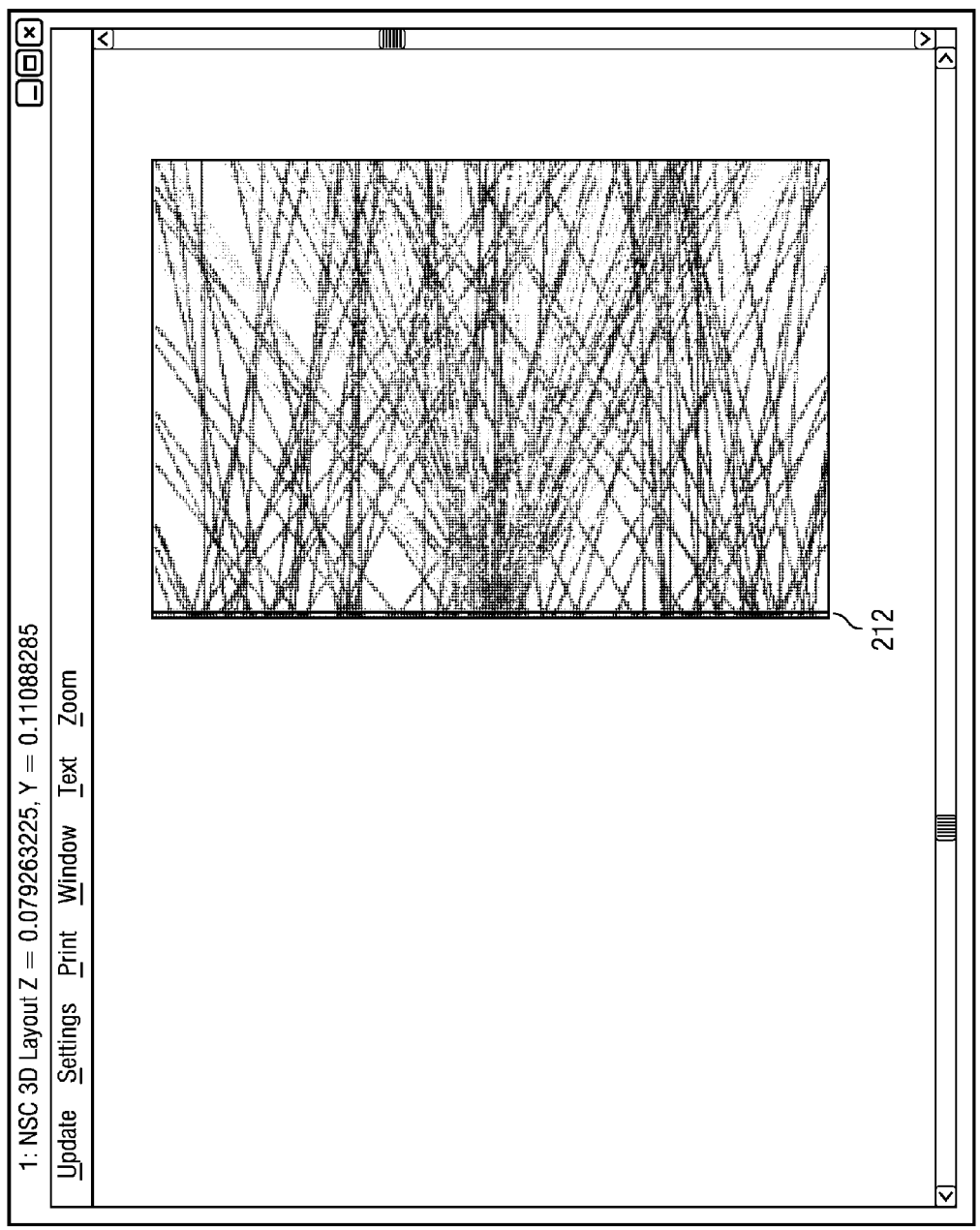

FIG. 14A is a diagrammatic representation of a ray tracing model for rays 210 in one embodiment of a multi-element optical stack 110. FIG. 14B illustrates the ray tracing at air gap 212. The ray tracing was performed using Zemax software. The model considers a non-coupled system having the properties given in Table 1 below for a 1 $mm^2$ source:

TABLE 1

| | | \multicolumn{5}{c}{Prescription} | | | |
|---|---|---|---|---|---|---|
| | | radius | conic | thickness | material | semi dia |
| | Obj | 0 | 0 | 0 | air | 0 |
| Lens 112 | surf1 | 0 | 0 | 5 | Acrylic | 4 |
| | surf2 | −3.25 | −0.6 | 1 | air | 4 |
| Lens 114 | surf1 | 0 | 0 | 5 | Acrylic | 5.5 |
| | surf2 | −5.5 | −0.4 | inf | air | 5.5 |

The size of second lens 114 is selected so that the exit aperture 118 of the multi-element optical stack is large enough to conserve radiance for a 10 degree beam angle (5 degree half angle). The shape of second lens 114 is selected to receive light in a beam angle from first lens 112 and shape the light into the desired 10 degree beam angle with a desired distribution profile. The size, shape and position of first lens 112 are selected to be large enough to collect almost all light emitted by the source (e.g., to provide an NA approaching unity) and to reduce the beam angle of light into a beam angle within the acceptance cone of second lens 114.

In operation, light rays 210 refract into first lens 112 from air gap 212. First lens 112 emits light in the acceptance cone of second lens 114. Second lens 114 emits the light received from first lens 112 in the desired full beam angle (e.g., 10 degrees) while conserving radiance.

Figure 15:
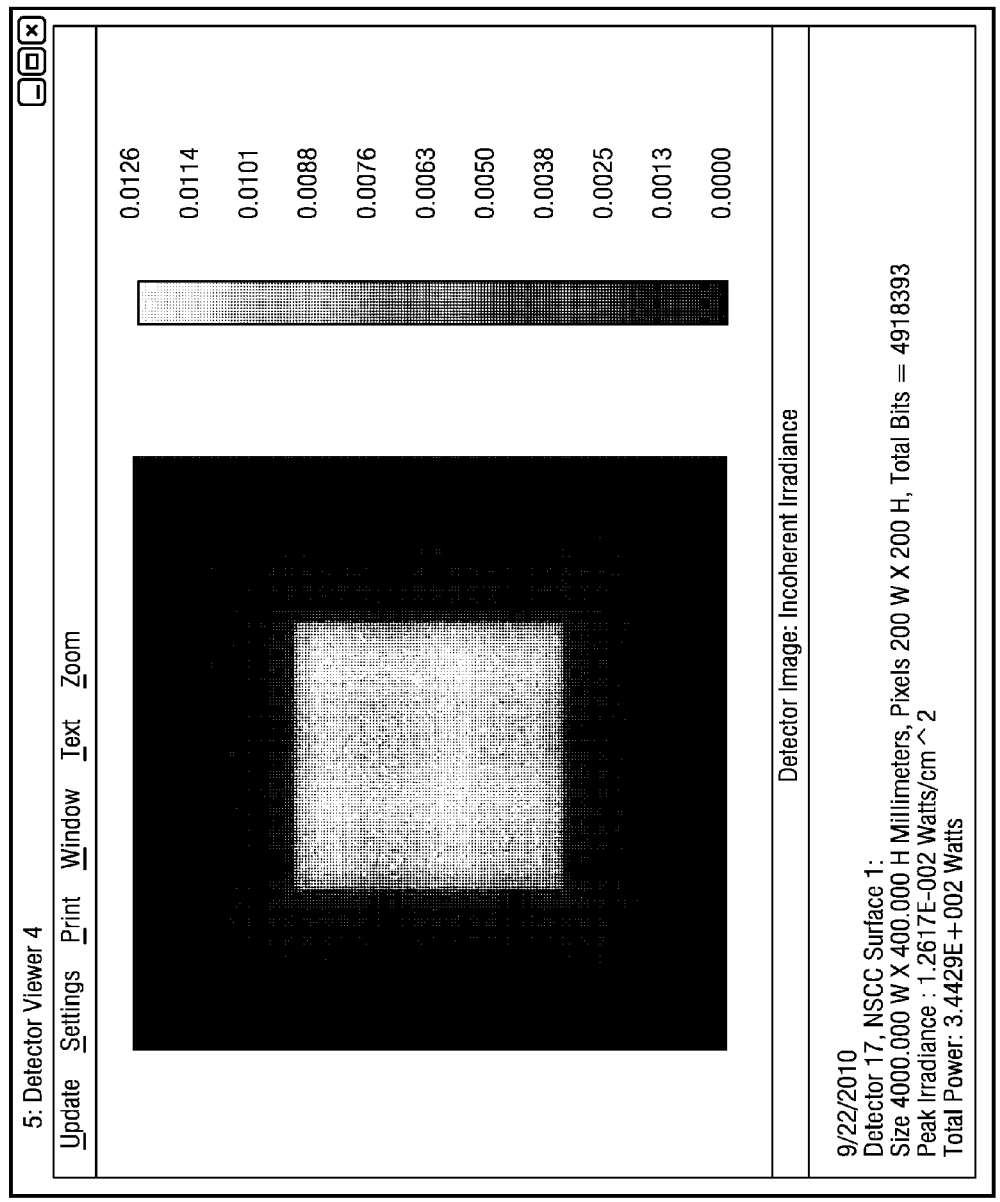
FIG. 15 is a diagrammatic representation of an intensity distribution for one embodiment of an optical system.
Figure 16:
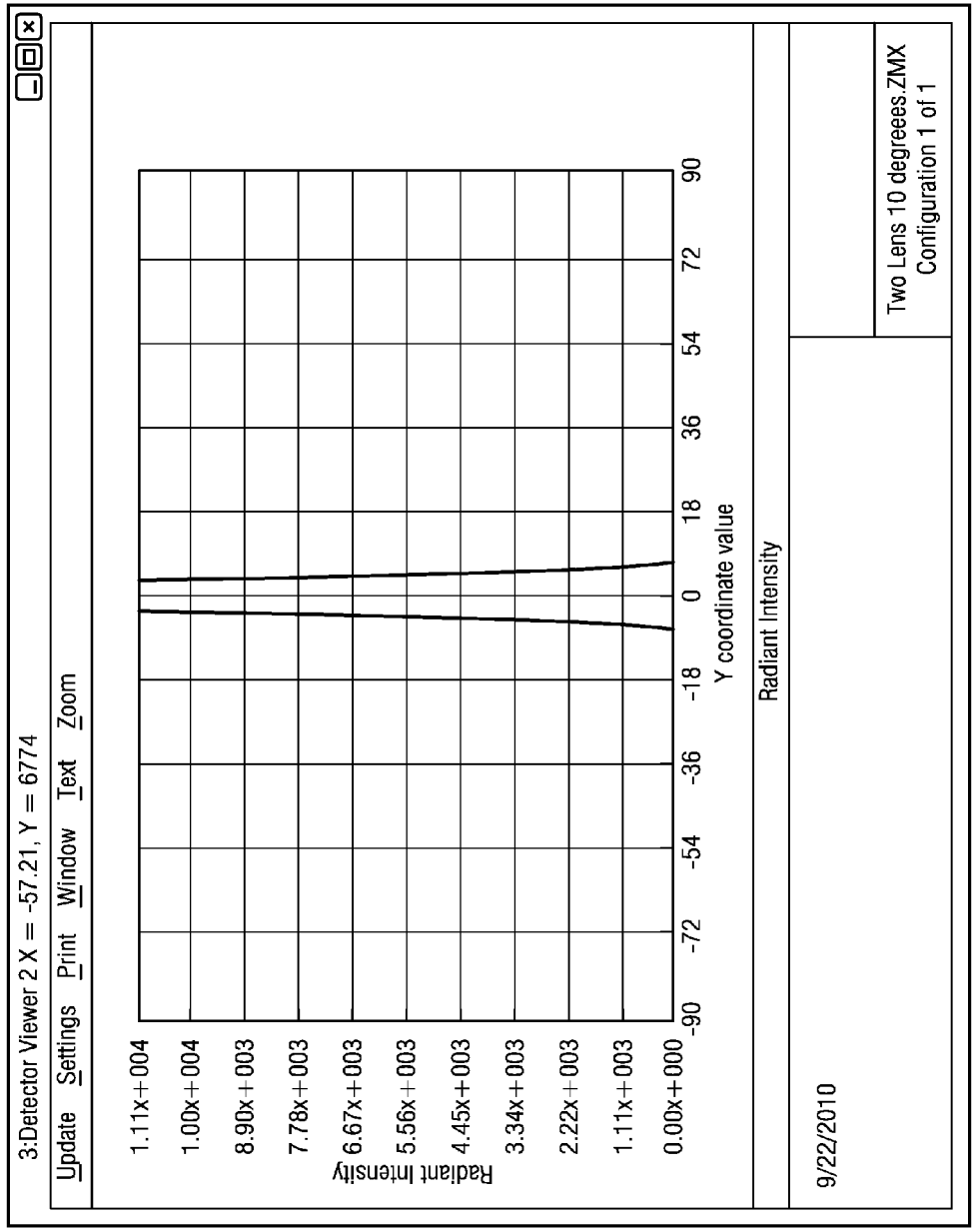
FIG. 16 is a chart of radiant intensity versus beam angle for one embodiment of an optical system.

FIG. 15 illustrates a model illumination pattern of light emitted by the optical device of FIGS. 14A and 14B. As can be seen in FIG. 15, the illumination profile within the selected angle can be highly uniform. Of 5,000,000 rays traced, greater than 4,910,000 rays (98% of the rays) arrive on the far field detector plane, indicating near conservation of radiance in the multi-element optical stack. FIG. 16 is a chart of radiant intensity (y-axis) versus beam angle (x-axis) and illustrates that the system of FIGS. 14A and 14B acts to create a "digital" light distribution in which greater than 80%, and in this case greater than 90%, of the light is within the desired beam angle and the remaining light is within a very small range to create a sharp cutoff.

Figure 17:
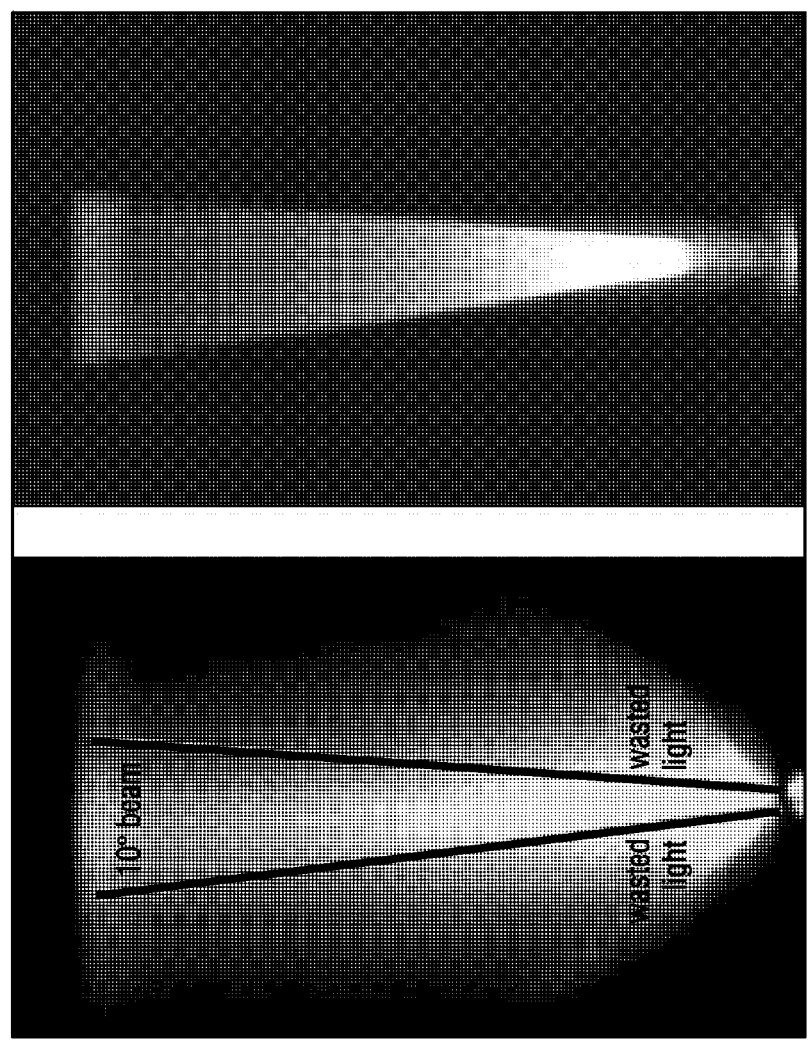
FIG. 17 is a diagrammatic representation illustrating the advantage of a high percentage of light in beam.

FIG. 17 illustrates the advantage of high light in beam. A high light in beam means that there is much less wasted light outside of desired projected beam angle. In FIG. 17, the beam difference between a system that provides 28% Lumens in Beam versus a system that provides 90% of Lumens in Beam to illustrate the advantages of embodiments described herein.

Figure 18:
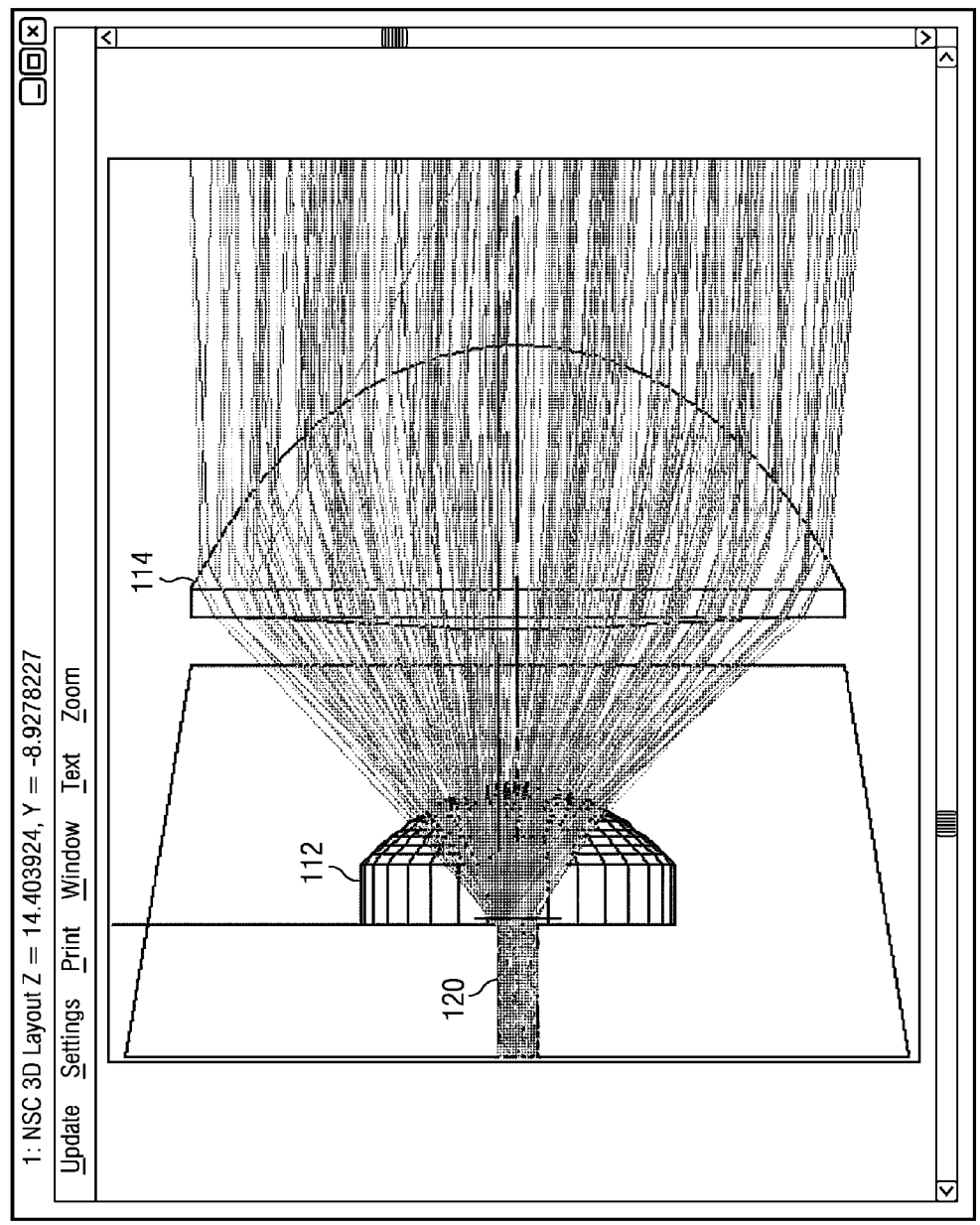
FIG. 18 is a diagrammatic representation of a ray tracing model for one embodiment of an optical system.

FIG. 18 is a diagrammatic representation of one embodiment of a model of a multi-element optical stack comprising a CVI Melles Griot LAG-15.0-12.0-C (Former Melles Griot Part No. 01 LAG 001) Aspheric Glass Condenser Lens, FL: 12 mm; EPD: 15 mm as first lens 112 (from CVI Melles Griot of Albuquerque, N. Mex.) and an Edmunds Optics NT66-013 TECHSPEC Plastic Aspheric Lens, FL 17.5 mm, EPD: 25 mm second lens 114 from Edmund Optics, Inc. of Barrington N.J. In the embodiment of FIG. 18, light from an LED or array of LEDs is directed to first lens 112 through a homogenizer 120 and directed to second lens 114 as discussed above. According to the embodiment of FIG. 18, which is for a 7 deg beam angle system, the lenses are 10 to 12 mm apart, plano surface to pseudo plano surface—mounting points on the lenses. The air gap point-to-point between the lenses is about 6.3 mm+/−1 mm. Again, however, it should be understood that the foregoing ranges are provided by way of example and not limitation.

Figure 19:
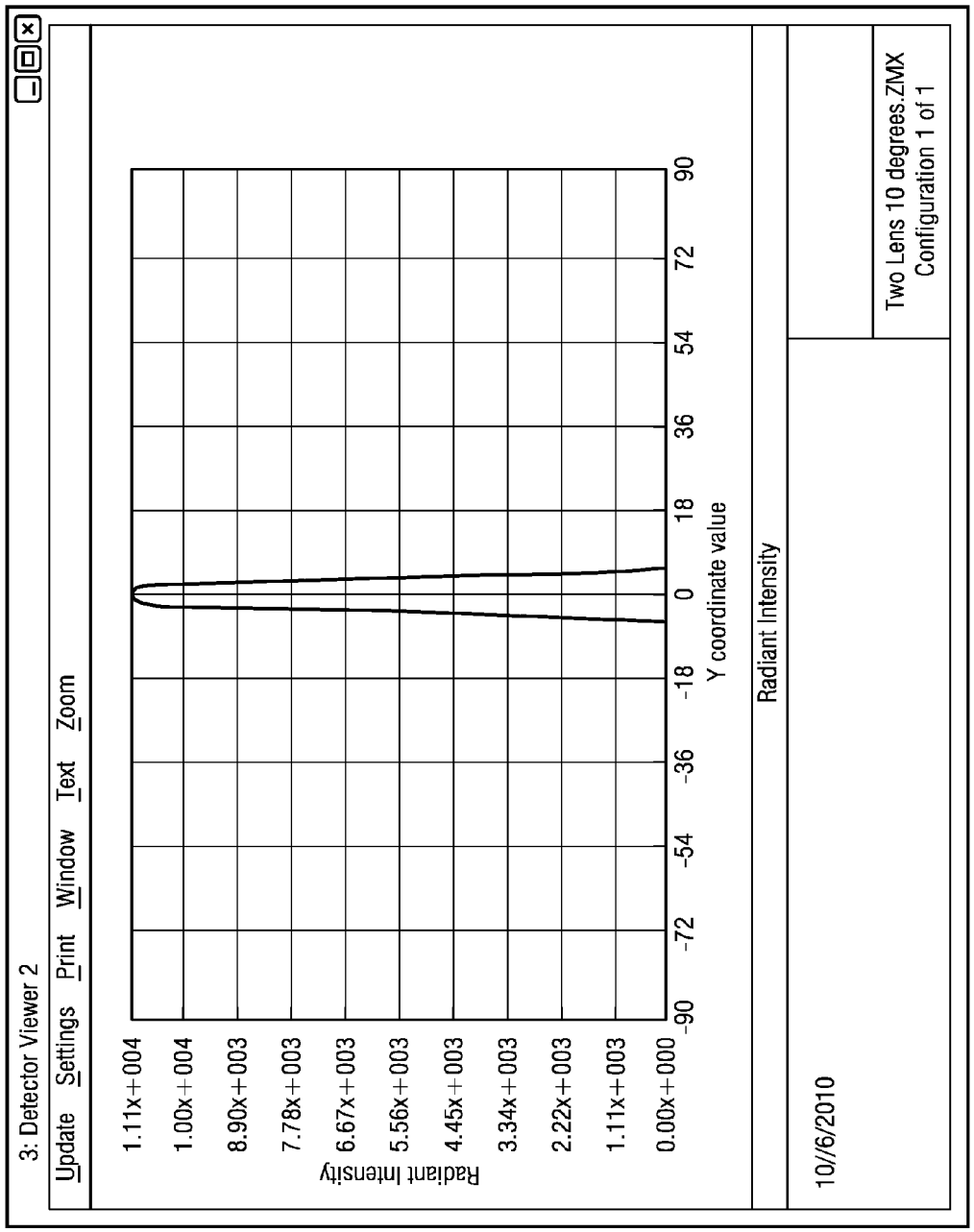
FIG. 19 is a chart of radiant intensity versus beam angle for one embodiment of an optical system.
Figure 20A:
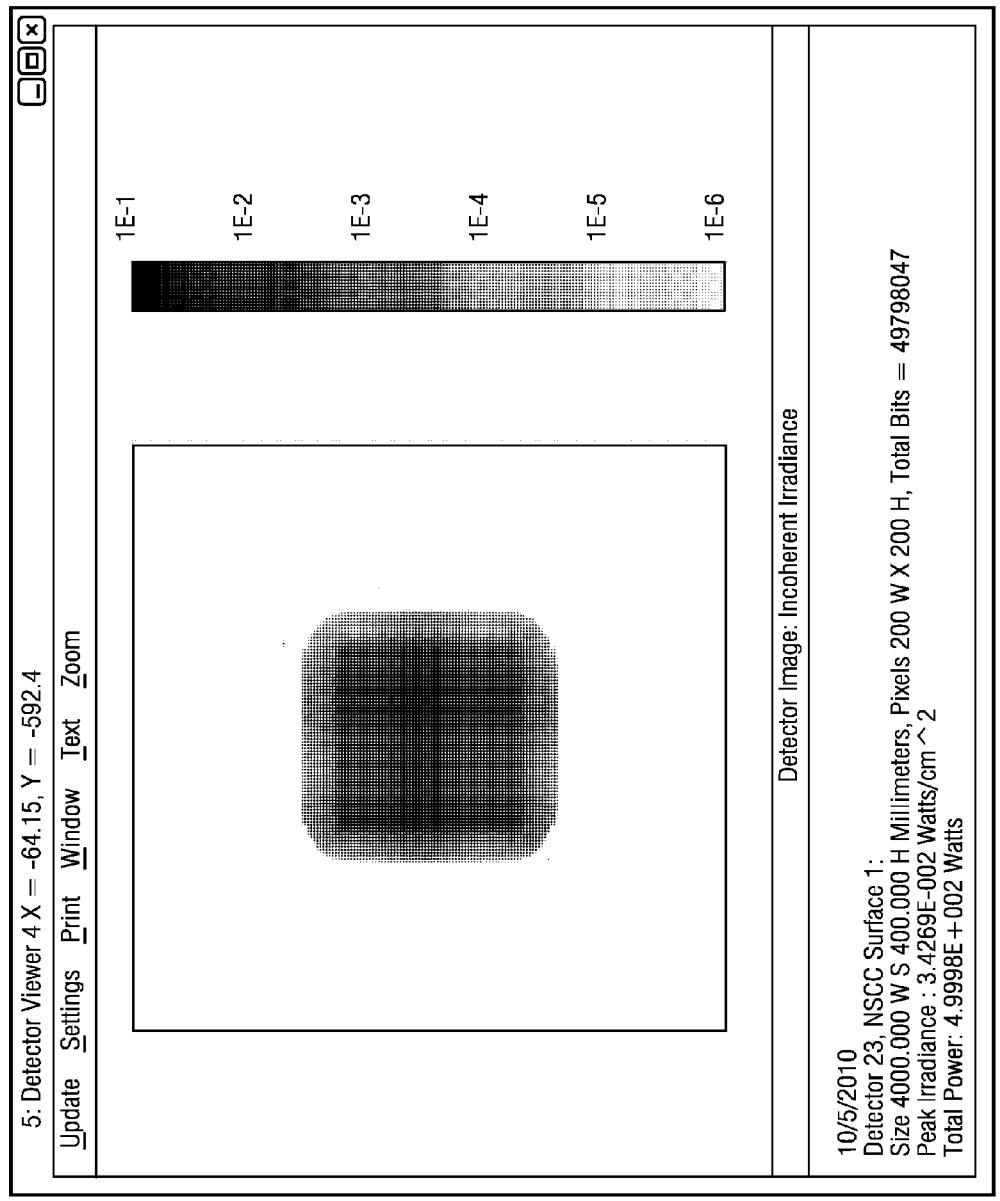
FIGS. 20A and 20B are diagrammatic representations of intensity distributions for one embodiment of an optical system.
Figure 20B:
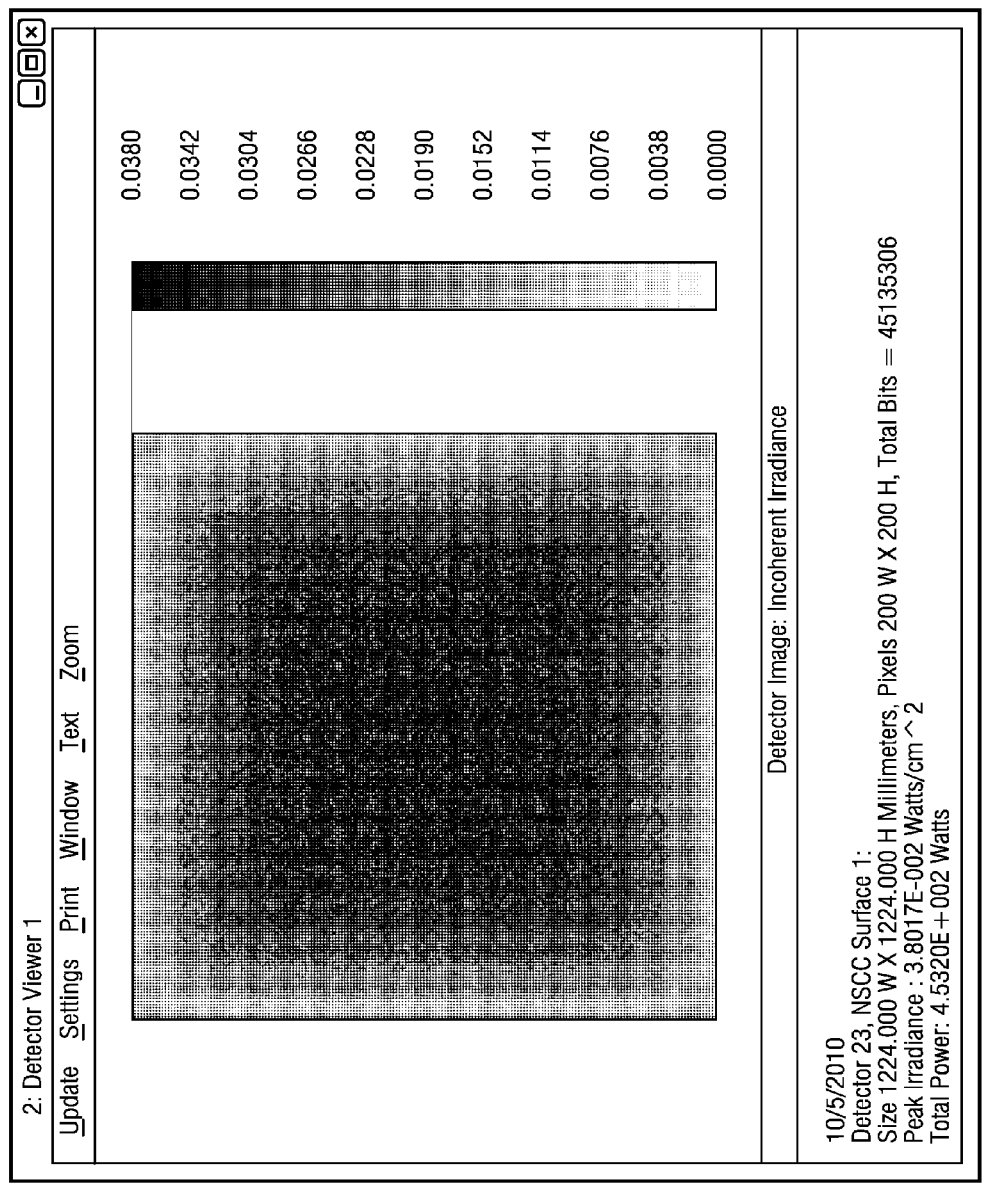

The modeled performance of such a system is that 90% of the emitted light is within a 7 degree full beam angle. FIG. 19 is a chart of radiant intensity (y-axis) versus beam angle (x-axis) and illustrates the digital light distribution with around 90% of the light in the full beam angle of 7 degrees. FIG. 20 illustrates modeled illumination patterns of light emitted by the system of FIG. 17.

Figure 21:
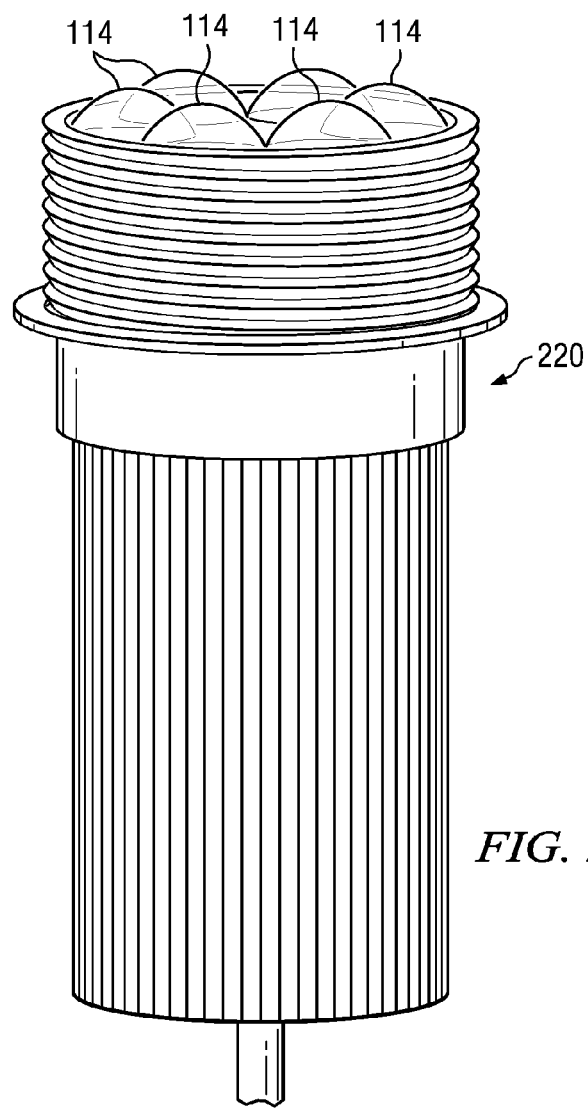
FIG. 21 is a diagrammatic representation of one embodiment of a downlight or spotlight.

FIG. 21 is a diagrammatic representation of an embodiment of a lighting system 220 having an array of second lenses 114. The secondary optics, according to one embodiment, can be formed from a single plate of material. Similar plates can be positioned below, internal to lighting system 220, to create a multi-element optical stack. Embodiments described herein can be formed with a tightly packed array of sources within one package. Array of second lenses 114 can be arranged so that the illumination patterns emitted by the secondary optics overlap. Since the intensity distribution of each optic system is the same, the overall illumination spot remains the relatively the same in the far field. The intensity of the distribution increases by the number of LEDs/optic system. Because the illumination patterns of the individual devices can be highly uniform, the overall illumination pattern can also be highly uniform.

Figure 22:
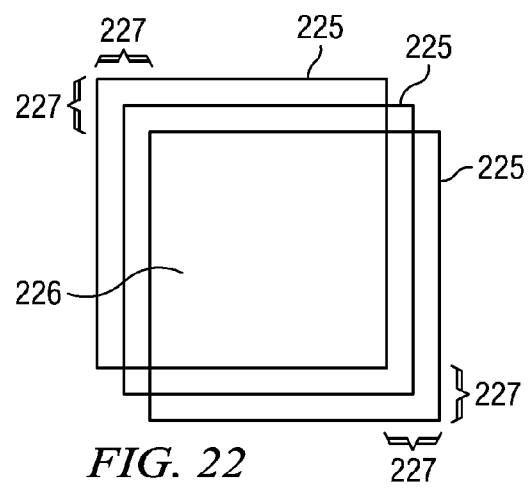
FIG. 22 is a diagrammatic representation illustrating one embodiment of color mixing.

Light to a multi-element optical stack can be provided by a single LED or an array of LEDs. If an array is used, the various LEDs can be controlled to emit a desired color of light so that a single optical system can emit various colors of light. Additionally, the illumination patterns of various optical systems can overlap to cause color mixing. FIG. 22, for example, illustrates that overlapping illuminated areas 225 that can be illuminated with a mix of color temperatures providing an overlap area 226 of very uniform color. As the distance between the illuminated surface and an array of optical systems grows, the width of the border area 227 stays the same size while the illuminated area grows. At far field, border area 227 becomes unnoticeable.

Multiple optical systems can be arranged such that the border areas overlap to create more uniformity in the border areas, leading to a larger illuminated area having a uniform profile. Due to the square or rectangular shape of the illuminated area created by an optical system, multiple arrays can be spaced at desired distances to provide uniform lighting over large areas. The overlap illuminated area will not have light and dark regions.

Thus, one embodiment can include an array of optical systems. Each optical system can be configured such that light is emitted with a uniform profile in a desired half angle with a hard cut off or a soft cut off. The optical systems can be configured to project an overall illumination pattern having an illuminated area with an overlap area and a border area. The overlap area can have a uniform profile, while the border area can have a different intensity than the overlap area. The size of the overlap area with uniform profile is dependent on the target surface (e.g., screen) to lens distance such that the size of the illuminated area grows as the target surface to lens distance grows. The width of the border area is not dependent on the target surface to lens distance. Consequently, as the target surface to lens distance increases the percentage of the overlap area having a uniform profile approaches 100%.

The color of the overlap area 226 can depend on the color emitted by each lens which, in turn, can depend on the color of light emitted by each source. For an LED source, the color can depend on the LEDs and phosphor selected. According to one embodiment, each LED can be a blue or ultraviolet LED used in conjunction with a pure phosphor or blend of phosphors so that the corresponding lens emits a desired color light. In other embodiments, some or all of the LEDs selected may emit a desired color light without using a phosphor coating. Thus, for example, some of the LEDs in the array can be blue or ultraviolet (or other color) LEDs used in conjunction with phosphors while other LEDs can be red (or other color) LEDs used without phosphors. The LEDs can be controlled so that the combined output in overlap area 226 has a desired spectral power distribution and color coordinates.

According to one embodiment the light sources can be selected to achieve desired x and y values in the 1931 CIE chromaticity diagram. In particular, the color coordinates of an array of optical systems can lie on or near the Planckian locus, thereby producing various shades of white light (e.g. "cool" white, "neutral" white, or "warm" white). While desirable regions around the Planckian locus in the chromaticity diagram are defined by the ANSI C78.377-2008 chromaticity standard, over a range of correlated color temperature (CCT) values, embodiments described herein may be used to achieve other color coordinates.

Embodiments of the present disclosure can achieve a high percentage of light the full beam angle, including at narrow angles. Additionally, optical elements can be selected to achieve a higher percent in beam (e.g., greater than 50%, greater than 60%, greater than 70% to greater than 90% and approaching 100%). In some embodiments, a high percent in beam can be achieved at narrow beam angles (e.g., full beam angles of 1-25 degrees). The optical elements can be further selected to have a high NA of greater than 0.85 to approaching unity. In a particular embodiment, an optical element stack can be selected to have an NA of greater 0.95 and an exit aperture having the minimum size necessary to conserve brightness for a narrow beam angle (e.g., a full beam (full width half maximum) angle of 10 degrees) while achieving greater than 95% efficiency and greater than 90% of light in beam.

Returning briefly to the embodiment of FIG. 7, first optical element 125, second optical element 127 and second lens 127 can have a variety of configurations. One embodiment of prescription is illustrated in FIG. 23. It should be understood that FIG. 23 is provided by way of example and not limitation.

Those skilled in the arts will appreciate after reading this disclosure that dimensions and other data provided herein are exemplary and that embodiments disclosed herein may be manufactured according to other dimensions or data without limiting the scope of the disclosure.

Embodiments described herein are provided by way of example. Embodiments described herein may be used to create light output of a desired shape. For example, the desire may be to create a more circular distribution, a more trapezoidal distribution, or a more rectangular distribution. This may be done through one or more optical elements to purposefully distort the image. For instance, a cylindrical lens may be added to focus in only one dimension yielding a more rectangular distribution. Freeform optics may be incorporated to generate other types of distributions.

Although embodiments have been described in detail herein, it should be understood that the description is by way of example only and is not to be construed in a limiting sense. It is to be further understood, therefore, that numerous changes in the details of the embodiments and additional embodiments will be apparent to, and may be made by, persons of ordinary skill in the art having reference to this description. It is contemplated that all such changes and additional embodiments are within scope of the disclosure and its legal equivalents.

What is claimed is:

1. An optical system to emit light in an emission beam angle comprising:
   an LED;
   a high numerical aperture multi-element imaging optical stack, the multi-element optical stack comprising a series of lenses, wherein the series of lenses comprise:
      a first lens positioned to receive light emitted in a first beam angle;
      a second lens more distal from the LED than the first lens, the second lens defining a second lens exit aperture that has at least a minimum area necessary to conserve radiance for the emission beam angle in air;
      wherein lenses in said series of lenses are configured, in combination, to successively reduce a beam angle of light from the first beam angle to the emission beam angle; and
   a homogenizer having an entrance face positioned to receive light from the LED and sidewalls extending from the entrance face of the homogenizer to the first lens.

2. The optical system of claim 1, wherein the lenses in said series of lenses are configured, in combination, to emit in the emission beam angle at least 80% of the light entering the multi-element optical stack.

3. The optical system of claim 1, wherein the multi-element optical stack has a numerical aperture of at least 0.85.

4. The optical system of claim 1, wherein the series of lenses further comprises an intermediate lens between the first lens and the second lens.

5. The optical system of claim 1, wherein the multi-element optical stack comprises a first optical element and a second optical element forming the first lens.

6. The optical system of claim 5, wherein the first optical element reduces the beam angle of light from the first beam angle to a second beam angle, the second optical element the beam angle of light from the second beam angle to a third beam angle and the second lens reduces the beam angle from the third beam angle to the emission beam angle.

7. The optical system of claim 1, wherein the homogenizer is untapered.

8. The optical system of claim 1, wherein the homogenizer is tapered.

9. The optical system of claim 1, further comprising:
   a homogenizer housing structure having a portion forming the homogenizer and a portion forming a first optical element;
   a second optical element coupled to the first optical element to form first lens.

10. The optical system of claim 9, wherein the homogenizer housing structure further defines a homogenizer cavity about the homogenizer.

11. The optical system of claim 10, further comprising a lens housing, wherein the lens housing comprises a portion that forms the second optical element.

12. The optical system of claim 11, wherein the lens housing further comprises an outer wall defining a homogenizer housing structure cavity to receive the homogenizer housing structure.

13. The optical system of claim 11, further comprising a second lens structure having a portion that forms the second lens.

14. The optical system of claim 13, wherein:
the lens housing defines a lens cavity surrounding the second optical element;
the lens housing comprising a lens cavity wall; and
the lens cavity wall supports the second lens structure with the second lens axially aligned with the first lens.

15. The optical system of claim 14, wherein the homogenizer is separated from the LED by an air gap.

16. An optical system to emit light in an emission beam angle comprising:
a source, further comprising an LED;
a homogenizer with a high numerical aperture relative to the source, wherein the homogenizer comprises an entrance face positioned to receive light from the source and sidewalls extending from the entrance face of the homogenizer to an exit of the homogenizer;
a high numerical aperture imaging multi-element optical stack having an entrance aperture to receive light from the homogenizer and exit aperture, the multi-element optical stack comprising:
a series of lenses optically coupled to the homogenizer, wherein lenses in said series of lenses are configured, in combination, to successively reduce a beam angle of light from a first beam angle to the emission beam angle and emit in the emission beam angle at least 80% of the light entering the series of lenses from the series of lenses.

17. The optical system of claim 16, wherein the series of lenses comprise:
a first lens optically coupled to and axially aligned with the homogenizer and positioned to receive light from the homogenizer in the first beam angle;
a second lens axially aligned with the first lens and more distal from the LED than the first lens, the second lens configured to emit light in the emission beam angle and defining the exit aperture, wherein the exit aperture has at least a minimum area necessary to conserve radiance for the emission beam angle in air.

18. The optical system of claim 17, wherein the second lens is optically coupled to the first lens through one or more intermediate lenses in the series of lenses.

19. The optical system of claim 16, further comprising phosphors disposed between the LED and the homogenizer.

20. The optical system of claim 16, wherein the entrance face of the homogenizer is separated from the LED by an air gap.

21. The optical system of claim 16, wherein the multi-element optical stack has a numerical aperture of greater than 0.85.

* * * * *